US012696485B2

(12) United States Patent
Lee et al.

(10) Patent No.: US 12,696,485 B2
(45) Date of Patent: Jul. 28, 2026

(54) SEMICONDUCTOR DEVICE

(71) Applicant: Samsung Electronics Co., Ltd., Suwon-si (KR)

(72) Inventors: Sunjung Lee, Suwon-si (KR); Donggon Yoo, Suwon-si (KR); Jeongwon Hwang, Suwon-si (KR); Sukhoon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 404 days.

(21) Appl. No.: 18/244,257

(22) Filed: Sep. 10, 2023

(65) Prior Publication Data

US 2024/0120392 A1      Apr. 11, 2024

(30) Foreign Application Priority Data

Oct. 11, 2022      (KR) ......................... 10-2022-0129357

(51) Int. Cl.
H01L 29/417          (2006.01)
H01L 29/06          (2006.01)
      (Continued)

(52) U.S. Cl.
CPC ......... H10D 30/6729 (2025.01); H10D 30/43 (2025.01); H10D 30/6735 (2025.01); H10D 30/6757 (2025.01); H10D 62/121 (2025.01)

(58) Field of Classification Search
CPC .............. H10D 30/6729; H10D 30/43; H10D 30/6735; H10D 30/6757; H10D 62/121;
      (Continued)

(56) References Cited

U.S. PATENT DOCUMENTS 9,105,636 B2      8/2015  Liu
10,651,085 B2      5/2020  Chang et al.
      (Continued)

FOREIGN PATENT DOCUMENTS

JP            7077734 B2      5/2022
KR      1020060071233 A      6/2006
      (Continued)

*Primary Examiner* — Tong-Ho Kim

(74) *Attorney, Agent, or Firm* — Muir Patent Law, PLLC

(57)          ABSTRACT

A semiconductor device includes a substrate including active regions extending in a first direction; a device isolation layer surrounding the active regions on the substrate; gate structures intersecting the active regions and extending on the substrate in a second direction; source/drain regions on the active regions; contact plugs connected to the source/drain regions, respectively; a vertical buried structure penetrating through at least a portion of the device isolation layer, and in contact with the contact plugs; a vertical insulating layer covering at least a portion of side surfaces of the vertical buried structure; a horizontal buried structure below the vertical buried structure; a first conductive barrier covering at least a portion of an upper surface and side surfaces of the horizontal buried structure; and a metal-semiconductor compound pattern between the vertical buried structure and the first conductive barrier, wherein the vertical buried structure is between source/drain regions.

20 Claims, 60 Drawing Sheets

(51) Int. Cl.

| | |
|---|---|
| *H01L 29/423* | (2006.01) |
| *H01L 29/775* | (2006.01) |
| *H01L 29/786* | (2006.01) |
| *H10D 30/43* | (2025.01) |
| *H10D 30/67* | (2025.01) |
| *H10D 62/10* | (2025.01) |

(58) Field of Classification Search
CPC .. H10D 30/014; H10D 62/151; H10D 84/834; H10D 30/62; H10D 62/115
USPC ......................................................... 257/288
See application file for complete search history.

(56) References Cited

U.S. PATENT DOCUMENTS

| | | | |
|---|---|---|---|
| 11,257,755 B2 | 2/2022 | Chen et al. | |
| 2020/0135578 A1 | 4/2020 | Ching et al. | |
| 2020/0373331 A1* | 11/2020 | Kim .................... | H10D 86/215 |
| 2021/0358848 A1 | 11/2021 | Wu et al. | |
| 2022/0181197 A1 | 6/2022 | Tao | |
| 2022/0181258 A1 | 6/2022 | Liebmann et al. | |
| 2023/0411471 A1* | 12/2023 | Cha .................... | H10D 84/0149 |

FOREIGN PATENT DOCUMENTS

| | | |
|---|---|---|
| KR | 1020190036521 A | 4/2019 |
| KR | 1020200133630 A | 11/2020 |
| KR | 1020210138468 A | 11/2021 |

* cited by examiner

100a

100e

100f

170B

195

195

150A

150B

192

172

170A

105

110

190

194

180

Z

X ← → Y

III

III'

SEMICONDUCTOR DEVICE

CROSS-REFERENCE TO RELATED APPLICATION(S)

This application claims priority under 35 U.S.C. § 119 to Korean Patent Application No. 10-2022-0129357, filed on Oct. 11, 2022, in the Korean Intellectual Property Office, the disclosure of which is incorporated herein by reference in its entirety.

BACKGROUND

1. Field

Example embodiments of the present disclosure relate to a semiconductor device.

2. Description of Related Art

As the demand for high performance, high speed, and multifunctionality of a semiconductor device has increased, integration density of a semiconductor device has also increased. In this regard, it is necessary to implement patterns having a fine width or a fine distance. Also, to address the limitations of operation properties due to the size reduction of a planar metal oxide semiconductor field effect transistor (MOSFET), there have been attempts to develop a semiconductor device including a FinFET having a three-dimensional channel structure.

SUMMARY

An example embodiment of the present disclosure is to provide a semiconductor device having improved integration density and electrical properties.

According to an example embodiment of the present disclosure, a semiconductor device includes a substrate including active regions extending in a first direction; a device isolation layer surrounding the active regions on the substrate; gate structures intersecting the active regions and extending on the substrate in a second direction; source/drain regions on the active regions at sides of the gate structures; contact plugs on the source/drain regions and connected to the source/drain regions, respectively; a vertical buried structure penetrating through at least a portion of the device isolation layer, spaced apart from the gate structures in the second direction, and in contact with the contact plugs; a vertical insulating layer covering at least a portion of side surfaces of the vertical buried structure; a horizontal buried structure below the vertical buried structure; a first conductive barrier covering at least a portion of an upper surface and side surfaces of the horizontal buried structure; and a metal-semiconductor compound pattern between the vertical buried structure and the first conductive barrier, wherein the vertical buried structure is between source/drain regions adjacent to each other in the second direction among the source/drain regions at the sides of the gate structures.

According to an example embodiment of the present disclosure, a semiconductor device includes a substrate including active regions extending in a first direction; a device isolation layer surrounding the active regions on the substrate; gate structures intersecting the active regions and extending on the substrate in a second direction; source/drain regions on the active regions at sides of the gate structures; contact plugs on the source/drain regions and connected to the source/drain regions, respectively; a vertical buried structure including a first vertical buried structure penetrating through at least a portion of the device isolation layer, and a second vertical buried structure spaced apart from the gate structures in the second direction and in contact with the contact plugs; a vertical insulating layer covering at least a portion of side surfaces of the vertical buried structures; a horizontal buried structure on a lower surface of the first vertical buried structure; and a first conductive barrier covering at least a portion of an upper surface and side surfaces of the horizontal buried structure, wherein the vertical buried structures are between source/drain regions adjacent to each other in the second direction among the source/drain regions at the sides of the gate structures.

According to an example embodiment of the present disclosure, a semiconductor device includes a substrate including active regions extending in a first direction; a device isolation layer surrounding the active regions on the substrate; gate structures intersecting the active regions and extending on the substrate in a second direction; source/drain regions on the active regions at sides of the gate structures; contact plugs on the source/drain regions and connected to the source/drain regions, respectively; vertical buried structures including a first vertical buried structure penetrating through at least a portion of the device isolation layer and a second vertical buried structure on the first vertical buried structure and in contact with the contact plugs; a vertical insulating layer covering at least a portion of side surfaces of the vertical buried structures; a horizontal buried structure below the first vertical buried structure; and a metal-semiconductor compound pattern on the first vertical buried structure and the horizontal buried structure, wherein an upper surface of the second vertical buried structure is on a level higher than a level of an upper surface of each of the source/drain regions, and wherein a lowermost portion of the vertical insulating layer is on a level lower than a level on which a maximum width of each of the source/drain region in the second direction is disposed.

BRIEF DESCRIPTION OF DRAWINGS

The above and other aspects, features, and advantages of the present disclosure will be more clearly understood from the following detailed description, taken in combination with the accompanying drawings, in which like numerals refer to like elements throughout. In the drawings:

FIGS. 8A and 8B are cross-sectional diagrams illustrating a semiconductor device according to an example embodiment of the present disclosure;

DETAILED DESCRIPTION

Figure 1:
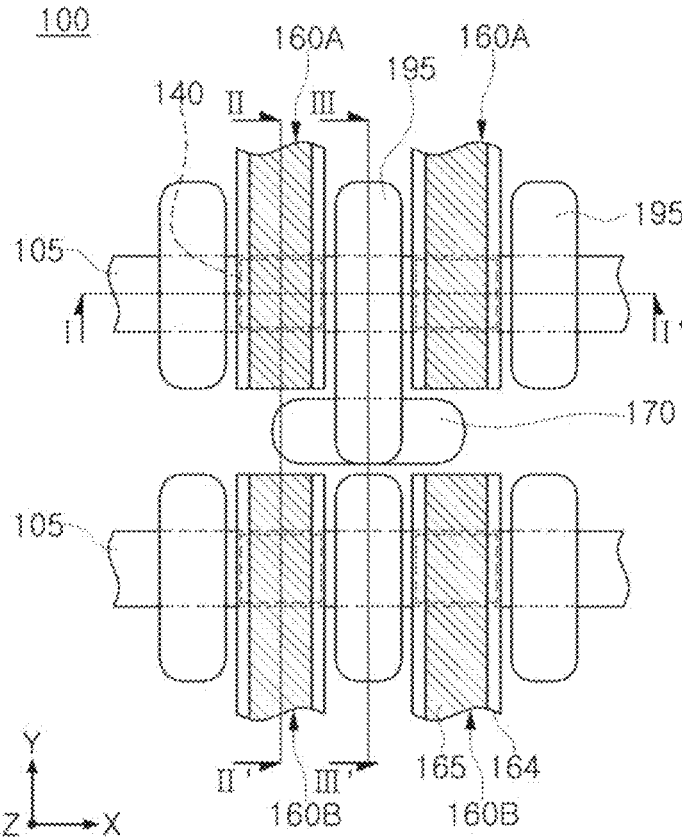
FIG. 1 is a plan diagram illustrating a semiconductor device according to an example embodiment of the present disclosure.

Hereinafter, embodiments of the present disclosure will be described as follows with reference to the accompanying drawings.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

FIG. 1 is a plan diagram illustrating a semiconductor device according to an example embodiment.

Figure 2A:
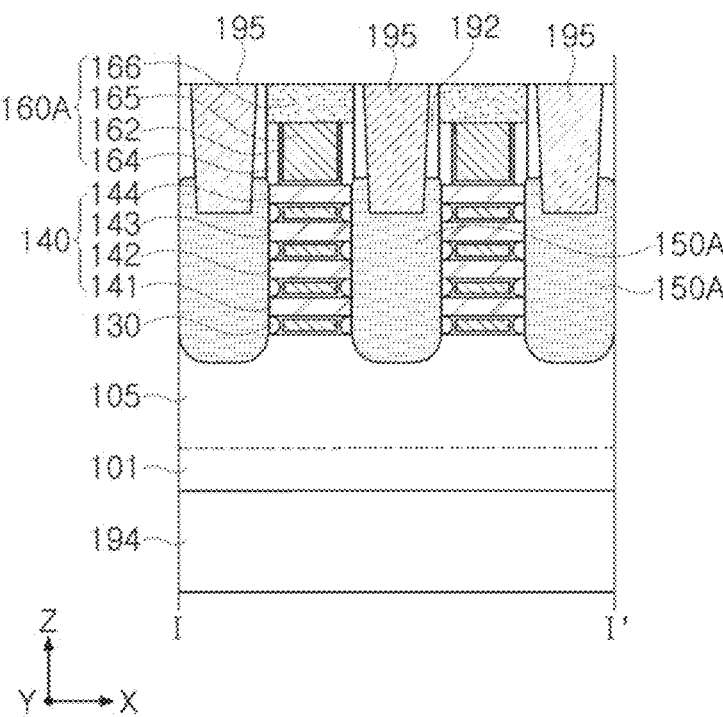
FIGS. 2A, 2B, and 2C are cross-sectional diagrams illustrating a semiconductor device according to an example embodiment of the present disclosure.
Figure 2B:
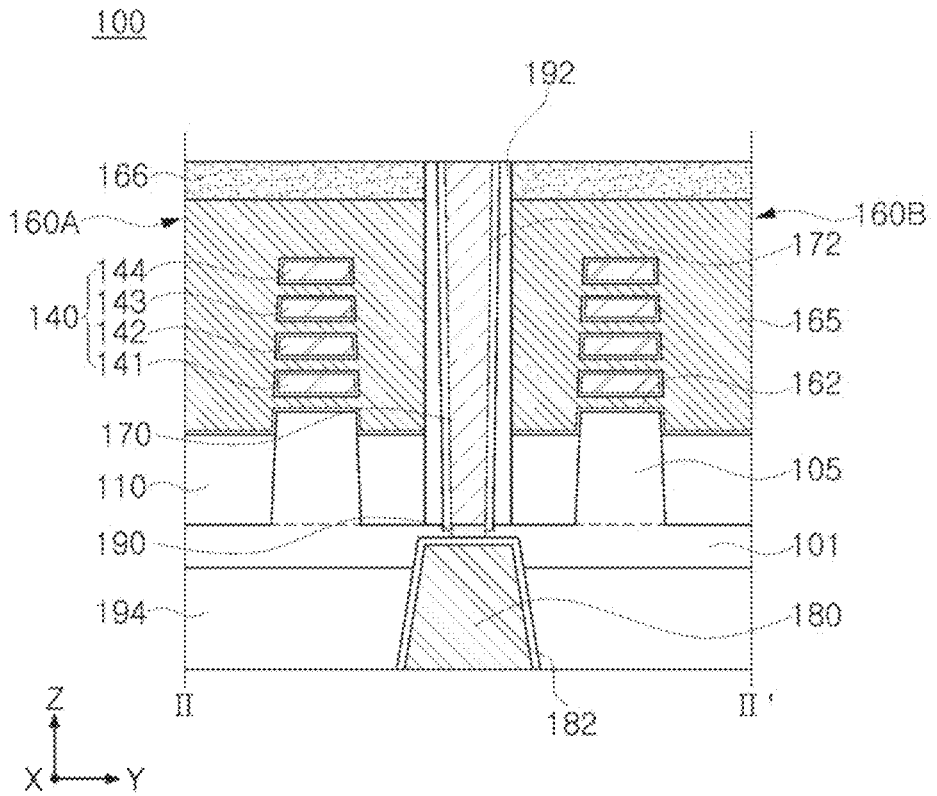
Figure 2C:
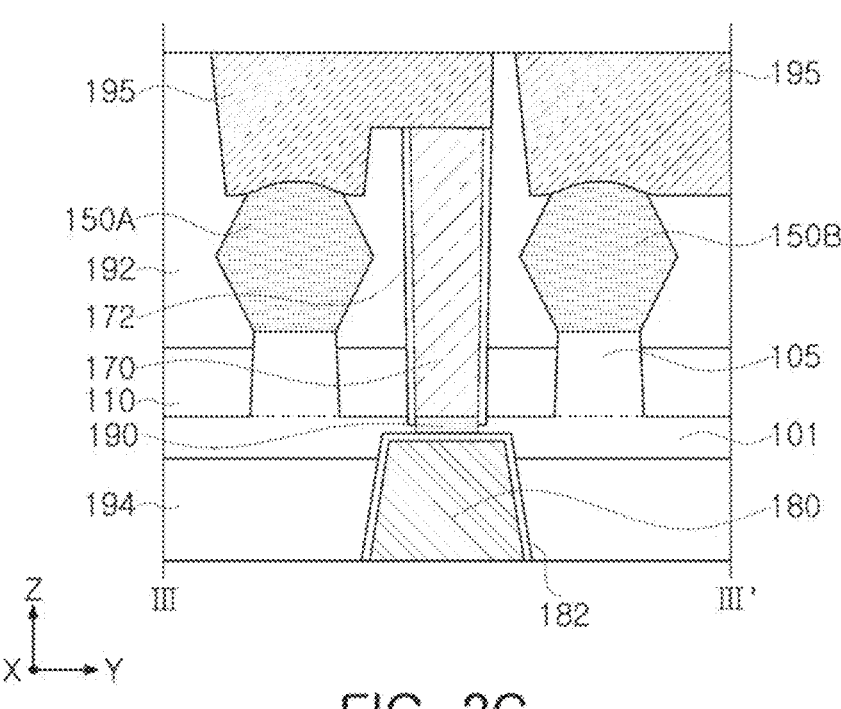

FIGS. 2A to 2C are cross-sectional diagrams illustrating a semiconductor device according to an example embodiment, taken along lines I-I', II-II', and III-III', respectively, in FIG. 1. For ease of description, FIG. 1 illustrates only a portion of components of the semiconductor device.

Referring to FIGS. 1 to 2C, a semiconductor device 100 may include a substrate 101 including active regions 105, channel structures 140 including first to fourth channel layers 141, 142, 143, and 144 vertically spaced apart from each other on the active regions 105, first and second gate structures 160A and 160B extending by intersecting the active regions 105 and including respective gate electrodes 165, first and second source/drain regions 150A and 150B in contact with the channel structures 140, contact plugs 195 connected to the first and second source/drain regions 150A and 150B, respectively, and a vertical buried structure 170 connected to the contact plugs 195. The semiconductor device 100 may further include a device isolation layer 110, internal spacer layers 130, a vertical insulating layer 172, a horizontal buried structure 180, a first conductive barrier 182, a metal-semiconductor compound pattern 190, and first and second interlayer insulating layers 192 and 194. Each of the first and second gate structures 160A and 160B may include gate dielectric layers 162, gate spacer layers 164, a gate electrode 165, and a gate capping layer 166.

In the semiconductor device 100, the gate electrodes 165 may be disposed between the active region 105 and the channel structures 140, between the first to fourth channel layers 141, 142, 143, and 144 of the channel structures 140, and on the channel structures 140. Accordingly, the semiconductor device 100 may include a multi-bridge channel field effect transistor (MBCFET™) structure transistor, which is a gate-all-around type field effect transistor.

The substrate 101 may have an upper surface extending in the X and Y-directions. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, or a semiconductor on insulator (SeOI) layer.

The substrate 101 may include active regions 105 disposed thereon. However, in example embodiments, the active regions 105 may be configured as a component separate from the substrate 101. In example embodiments, the substrate 101 below the active regions 105 may be removed.

The active regions 105 may be disposed to extend lengthwise in a first direction, for example, an X-direction. Active regions 105 may be defined at a predetermined depth from an upper surface in a portion of the substrate 101. The active regions 105 may be formed of a portion of the substrate 101 (e.g., formed by etching the substrate 101) or may be formed on the substrate 101 (e.g., an epitaxial layer grown from the substrate 101). Each of the active regions 105 may include active fins protruding upwardly. In example embodiments, uppermost surfaces of the active regions 105 may be substantially planar. The active regions 105 may, together with the channel structures 140, form an active structure in which a channel region of a transistor is formed. Each of the active regions 105 may include an impurity region. The impurity region may form at least a portion of a well region of a transistor.

The device isolation layer 110 may be disposed between adjacent active regions 105 in the Y-direction. In example embodiments, an upper surface of the device isolation layer 110 may be substantially planar. Upper surfaces of the active regions 105 may be disposed on a level higher than a level of the upper surface of the device isolation layer 110. The active regions 105 may be partially recessed on both sides of the first and second gate structures 160A and 160B, and first and second source/drain regions 150A and 150B may be disposed on the recess regions, respectively.

The device isolation layer 110 may fill a region between the active regions 105 and may define the active regions 105 on the substrate 101. The device isolation layer 110 may be formed by, for example, a shallow trench isolation (STI) process. The device isolation layer 110 may expose the upper surface of the active region 105 or may partially expose the upper surface. The device isolation layer 110 may be formed of an insulating material. The device isolation layer 110 may include, for example, an oxide, a nitride, or a combination thereof.

The gate structures 160 may include first and second gate structures 160A and 160B. The first and second gate structures 160A and 160B may intersect the active regions 105 on the active regions 105 and may extend lengthwise in a second direction, for example, a Y-direction. Channel regions of transistors may be formed in the active regions 105 and the channel structure 140 intersecting the gate electrodes 165 of the first and second gate structures 160A and 160B. The first gate structure 160A and the second gate structure 160B may be disposed on a linear line in the Y-direction and may be spaced apart from each other, but an example embodiment thereof is not limited thereto. The first gate structure 160A and the second gate structure 160B may be included in transistors having different electrical properties.

Each of the first and second gate structures 160A and 160B may include gate dielectric layers 162, gate spacer layers 164, and a gate electrode 165. In example embodiments, each of the first and second gate structures 160A and 160B may further include a gate capping layer 166 on an upper surface of the gate electrode 165.

The gate dielectric layers 162 may be disposed between the active region 105 and the gate electrode 165 and may between the channel structure 140 and the gate electrode 165, and may cover at least a portion of the surfaces of the gate electrode 165. For example, the gate dielectric layers 162 may be disposed to surround the surfaces other than the uppermost surface of the gate electrode 165. The gate dielectric layers 162 may extend to a region between the gate electrode 165 and the gate spacer layers 164, but an example embodiment thereof is not limited thereto. The gate dielectric layer 162 may include an oxide, nitride, or high-κ material. The high-κ material may refer to a dielectric material having a dielectric constant higher than that of silicon oxide ($SiO_2$). The high-κ material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In example embodiments, the gate dielectric layer 162 may have a multilayer structure.

The gate electrode 165 may include a conductive material, for example, a metal nitride such as titanium nitride (TiN), tantalum nitride (TaN), or tungsten nitride (WN), and/or a metal material such as aluminum (Al), tungsten (W), or molybdenum (Mo), or a semiconductor material such as doped polysilicon. In example embodiments, the gate electrode 165 may have a multilayer structure.

The gate spacer layers 164 may be disposed on both side surfaces of the gate electrode 165 on the channel structure 140. For example, the gate spacer layers 164 may contact the side surfaces of the gate electrode 165, the upper surface of the fourth channel layer 144, a side surface of the first interlayer insulating layer 192, and surfaces of the first and second source/drain regions 150A and 150B. In example embodiments, upper surfaces of the gate dielectric layers 162, the gate spacer layers 164, and the gate electrode 165 may be coplanar with one another. The gate spacer layers 164 may insulate the first and second source/drain regions 150A and 150B from the gate electrodes 165. In example embodiments, the shape of the upper end of the gate spacer layers 164 may be varied, and the gate spacer layers 164 may have a multilayer structure. The gate spacer layers 164 may include at least one of oxide, nitride, and oxynitride, and may be formed of, for example, a low-κ film.

In example embodiments, the first gate structure 160A and the second gate structure 160B may be configured such that materials of the gate electrode 165 may be different or lengths of the gate electrode 165 in the X-direction may be different.

The gate capping layer 166 may be disposed on the gate electrode 165, and may be surrounded by a lower surface of the gate electrode 165 and the gate spacer layers 164. For example, a lower surface of the gate capping layer 166 may contact upper surfaces of the gate electrode 165 and the gate spacer layers 164.

The channel structures 140 may be disposed on the active regions 105 in regions in which the active regions 105 intersect the first and second gate structures 160A and 160B. Each of the channel structures 140 may include first to fourth channel layers 141, 142, 143, and 144 which may be two or more channel layers spaced apart from each other in the Z-direction. The channel structures 140 may be connected to the first and second source/drain regions 150A and 150B. The channel structures 140 may have a width equal to or smaller than that of the active region 105 in the Y-direction, and may have a width equal to or similar to that of the first and second gate structures 160A and 160B in the X-direction. In a cross-section taken in the Y-direction, a lower channel layer among the first to fourth channel layers 141, 142, 143, and 144 may have a width equal to or larger than that of the upper channel layer. In example embodiments, the channel structures 140 may have a reduced width as compared to those of the first and second gate structures 160A and 160B such that side surfaces may be disposed below the first and second gate structures 160A and 160B in the X-direction.

The channel structures 140 may be formed of a semiconductor material, and may include, for example, at least one of silicon (Si), silicon germanium (SiGe), and germanium (Ge). The channel structures 140 may be formed of, for example, the same material as that of the active regions 105. The number of channel layers included in the channel structure 140 and the shape thereof may be varied in example embodiments.

The first and second source/drain regions 150A and 150B may be in contact with the channel structures 140, respectively on both sides of the first and second gate structures 160A and 160B. The first and second source/drain regions 150A and 150B may be disposed in regions in which an upper portion of the active region 105 is partially recessed. The first source/drain regions 150A may be disposed between adjacent ones of the first gate structures 160A, and the second source/drain regions 150B may be disposed between adjacent ones of the second gate structures 160B. The first and second source/drain regions 150A and 150B may be electrically connected to the horizontal buried structure 180 through contact plugs 195 and vertical buried structures 170A and 170B and may receive power.

The upper surfaces of the first and second source/drain regions 150A and 150B may be disposed on a level the same as or similar to a level of the lower surfaces of the first and second gate structures 160A and 160B on the channel structures 140. However, the level of the upper surfaces of the first and second source/drain regions 150A and 150B may be varied in example embodiments. The first and second source/drain regions 150A and 150B may have a polygonal shape or an elliptical shape as illustrated in FIG. 2C in a cross-section taken in the Y-direction, but an example embodiment thereof is not limited thereto. The first and second source/drain regions 150A and 150B may include a semiconductor material, for example, silicon (Si) and/or germanium (Ge), and may further include impurities.

The internal spacer layers 130 may be disposed parallel to the gate electrode 165 between the first to fourth channel layers 141, 142, 143, and 144 in the Z-direction. The gate electrode 165 may be stably spaced apart from and electrically separated from the first and second source/drain regions 150A and 150B by the internal spacer layers 130. The internal spacer layers 130 may have a shape in which a side surface opposing the gate electrode 165 may be inwardly rounded toward the gate electrode 165, but an example embodiment thereof is not limited thereto. The internal spacer layers 130 may include at least one of oxide, nitride, and oxynitride, and may be formed of, for example, a low-κ film. However, in example embodiments, the internal spacer layers 130 may not be provided.

The contact plugs 195 may be disposed on the first and second source/drain regions 150A and 150B. The contact plugs 195 may penetrate through the first interlayer insulating layer 192 and may be connected to the first and second source/drain regions 150A and 150B.

The contact plugs 195 may have inclined side surfaces such that a width thereof may decrease toward the substrate 101 due to an aspect ratio, but an example embodiment thereof is not limited thereto. The contact plugs 195 may be partially recessed into the first and second source/drain regions 150A and 150B, such that the contact plugs 195 may be in contact with a portion of the upper surface and the inclined side surfaces of the first and second source/drain regions 150A and 150B. Alternatively, in example embodiments, the contact plugs 195 may be disposed to be in contact with the upper surface without being recessed into the first and second source/drain regions 150A and 150B. Gate contact plugs may be further disposed on the gate electrodes 165 in regions not illustrated.

Each of the contact plugs 195 may include a metal silicide layer disposed on a lower end thereof, and may further include a barrier layer disposed on the metal silicide layer and sidewalls. The barrier layer may include, for example, a metal nitride such as titanium nitride (TiN), tantalum nitride (TaN), or tungsten nitride (WN). The contact plugs 195 may include, for example, a metal material such as aluminum (Al), tungsten (W), or molybdenum (Mo). In example embodiments, the number of conductive layers included in the contact plugs 195 and arrangement thereof may be varied.

The vertical buried structure 170 may be disposed to connect the contact plugs 195 to the horizontal buried structure 180. The vertical buried structure 170 may be spaced apart from the first and second gate structures 160A and 160B in the Y-direction. The vertical buried structure 170 may at least partially overlap the contact plugs 195 in the Y-direction and in the Z-direction perpendicular to the upper surface of the substrate 101. As illustrated in FIG. 1, the vertical buried structure 170 may be disposed in a region in which the first gate structure 160A and the second gate structure 160B are spaced apart in the Y-direction and/or a region in which the first gate structure 160A and the second gate structure 160B extend in the X direction and overlap each other as illustrated in FIG. 1. Accordingly, the vertical buried structure 170 may not overlap the first and second gate structures 160A and 160B in the X-direction.

The vertical buried structure 170 may have an inclined side surface such that a width thereof may decrease toward the substrate 101 due to the aspect ratio, but an example embodiment thereof is not limited thereto. In the vertical buried structure 170, both side surfaces in the Y-direction may include regions having different slopes. As illustrated in FIG. 2C, the vertical buried structure 170 may be disposed between the first source/drain region 150A and the second source/drain region 150B adjacent to each other in the Y-direction. The vertical buried structure 170 may include a conductive material, for example, a metal material such as molybdenum (Mo), ruthenium (Ru), or tungsten (W).

The vertical buried structure 170 may penetrate at least a portion of the device isolation layer 110. The lower surface of the vertical buried structure 170 may be disposed on a level lower than a level of the lower surface of each of the source/drain regions 150A and 150B, but an example embodiment thereof is not limited thereto, and the lower surface of the vertical buried structure 170 may be disposed on a level lower than a level of the upper and lower surface of each of the active regions 105. A lower surface of the vertical buried structure 170 may be in contact with the first conductive barrier 182. The upper surface or upper end of the vertical buried structure 170 may be disposed on a level higher than a level of the upper surface or upper end of each of the source/drain regions 150A and 150B. The vertical buried structure 170 may be in contact with the contact plugs 195 through the upper surface.

The vertical insulating layer 172 may be disposed to cover a portion of the side surfaces of the vertical buried structure 170. The vertical insulating layer 172 may cover at least a portion of the side surfaces of the vertical buried structure 170. In example embodiments, an upper surface of the vertical insulating layer 172 may be coplanar with an upper surface of the vertical buried structure 170. The vertical insulating layer 172 may include an insulating material, and may include, for example, at least one of oxide, nitride, and oxynitride.

In an example embodiment, the lowermost portion of the vertical insulating layer 172 may be disposed on the substantially the same level as a level of portion having the largest width of each of the first and second source/drain regions 150A and 150B in the second direction Y, or may be disposed on a level lower than the level of portion, but an example embodiment thereof is not limited thereto.

In an example embodiment, the lowermost portion of the vertical insulating layer 172 may be disposed on a level lower than a level of the lowermost portion of each of the first and second gate structures 160A and 160B, but an example embodiment thereof is not limited thereto.

In an example embodiment, the lowermost portion of the vertical insulating layer 172 may be disposed on a level lower than a level of an upper surface of the substrate 101. For example, the lowermost portion of the vertical insulating layer 172 may penetrate the upper surface of the substrate 101. The first interlayer insulating layer 192 and the device isolation layer 110 may surround and contact a side surface of the vertical insulating layer 172.

The horizontal buried structure 180 may be disposed below the vertical buried structure 170 and may be connected to the lower end or lower surface of the vertical buried structure 170. The horizontal buried structure 180 may be disposed on a lower surface of the vertical buried structure 170 and may be spaced apart from the vertical insulating layer 172. The horizontal buried structure 180 may form a backside power delivery network (BSPDN) applying power or ground voltage, and may also be referred to as a buried power rail. For example, the horizontal buried structure 180 may be a buried wiring line extending from the region below the vertical buried structure 170 in one direction, for example, in the X-direction, but the shape of the horizontal buried structure 180 is not limited thereto. The horizontal buried structure 180 may be further connected to a vertical buried structure 170 not illustrated in a region not illustrated.

The horizontal buried structure 180 may have inclined side surfaces such that a width thereof may decrease upwardly. That is, the horizontal buried structure 180 may have a trapezoidal shape. The horizontal buried structure 180 may include at least one of a conductive material such as tungsten (W), copper (Cu), cobalt (Co), ruthenium (Ru), and molybdenum (Mo).

The first conductive barrier 182 may cover at least a portion of the upper surface and side surfaces of the horizontal buried structure 180. For example, the first conductive barrier 182 may contact the upper and side surfaces of the horizontal buried structure 180. Side surfaces of the first conductive barrier 182 may be covered by the second interlayer insulating layer 194. In example embodiments, the substrate 101 and the second interlayer insulating layer 194 may contact the side surfaces of the first conductive barrier 182. The first conductive barrier 182 may be in contact with the lower surface of the vertical buried structure 170. The first conductive barrier 182 may include, for example, a metal nitride such as titanium nitride (TiN), tantalum nitride (TaN), molybdenum nitride (MoN), or tungsten nitride (WN), but an example embodiment thereof is not limited thereto.

The metal-semiconductor compound pattern 190 may be disposed below the vertical buried structure 170 and on the first conductive barrier 182. The metal-semiconductor compound pattern 190 may be in contact with the vertical buried structure 170, the vertical insulating layer 172, and the first conductive barrier 182. The upper surface of the metal-semiconductor compound pattern 190 and the lower surface of the vertical buried structure 170 may be in contact with each other. The lower surface of the metal-semiconductor compound pattern 190 may be in contact with the first conductive barrier 182. The metal-semiconductor compound pattern 190 may penetrate at least a portion of the substrate 101. The metal-semiconductor compound pattern 190 may be, for example, a metal silicide layer such as $TiSi_x$.

In an example embodiment, the vertical insulating layer 172 may cover at least a portion of a side surface of the metal-semiconductor compound pattern 190. For example, the upper surface of the metal-semiconductor compound pattern 190 may be in contact with the lower surface of the vertical buried structure 170. A portion of the side surface of the metal-semiconductor compound pattern 190 may be in contact with the vertical insulating layer 172. A portion of the side surface of the metal-semiconductor compound pattern 190 may be in contact with the substrate 101. A lower surface of the metal-semiconductor compound pattern 190 may be in contact with the first conductive barrier 182.

The first interlayer insulating layer 192 may cover at least a portion of the first and second source/drain regions 150A and 150B, the first and second gate structures 160A and 160B, the substrate 101, and the device isolation layer 110. Specifically, the first interlayer insulating layer 192 may contact upper surfaces of the first and second source/drain regions 150A and 150B, side surfaces of the first and second gate structures 160A and 160B, the upper surface of the substrate 101, and upper and side surfaces of the device isolation layer 110. The second interlayer insulating layer 194 may be disposed to cover the lower surface of the substrate 101 and to surround the horizontal buried structure 180. For example, the second interlayer insulating layer 194 may contact the lower surface of the substrate 101.

The first and second interlayer insulating layers 192 and 194 may include at least one of an oxide, a nitride, and an oxynitride, and may include, for example, a low-κ material. In example embodiments, each of the first and second interlayer insulating layers 192 and 194 may include a plurality of insulating layers.

The semiconductor device 100 may be packaged by inverting the structure in FIGS. 2A to 2C such that the horizontal buried structure 180 may be disposed on the upper portion, but the packaging form of the semiconductor device 100 is not limited thereto. Since the semiconductor device 100 may include the horizontal buried structure 180 disposed below the first and second source/drain regions 150A and 150B, integration density may be improved.

In the description below, descriptions duplicating the descriptions described above with reference to FIGS. 1 to 2C will not be provided.

Figure 3A:
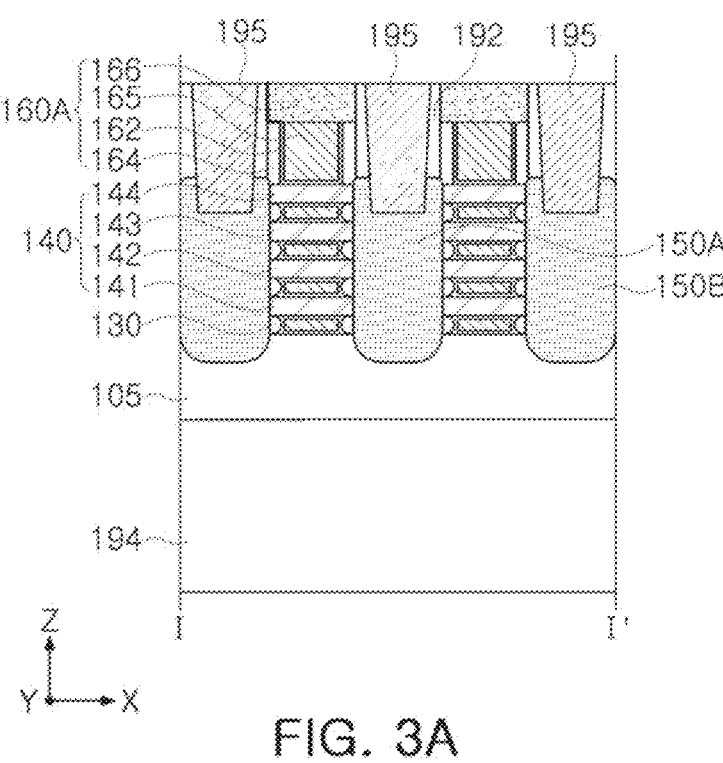
FIGS. 3A, 3B, and 3C are cross-sectional diagrams illustrating a semiconductor device according to an example embodiment of the present disclosure.
Figure 3B:
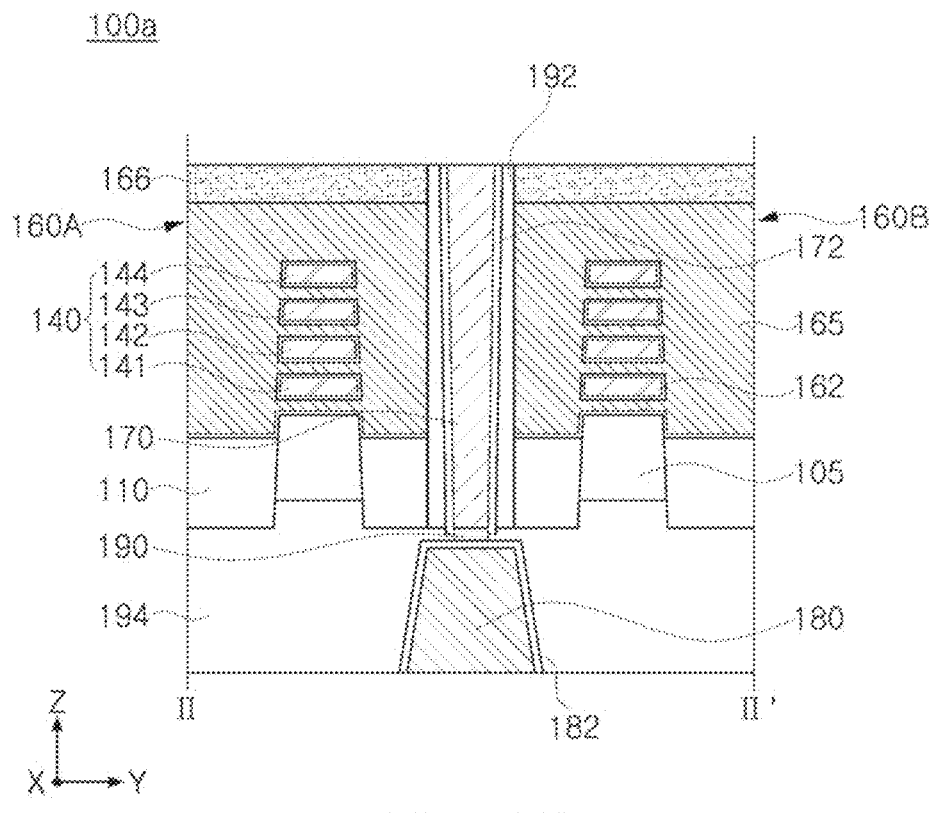
Figure 3C:
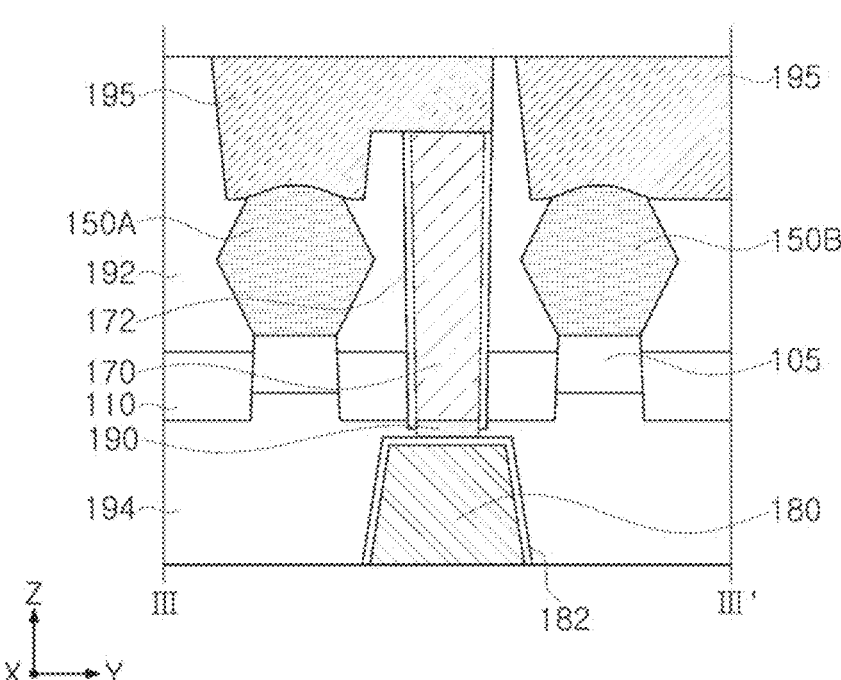

FIGS. 3A to 3C are cross-sectional diagrams illustrating a semiconductor device according to an example embodiment, illustrating cross-sections corresponding to FIGS. 2A to 2C.

Referring to FIGS. 3A to 3C, in the semiconductor device 100a, differently from the example embodiment in FIGS. 1 to 2C, the uppermost portion of the second interlayer insulating layer 194 may be disposed on a level higher than a level of the lowermost portion of the device isolation layer 110. During the process in FIG. 22, the substrate 101 may be completely removed from the device isolation layer 110. Accordingly, the metal-semiconductor compound pattern 190 may be exposed. Also, the metal-semiconductor compound pattern 190, the first conductive barrier 182, and the horizontal buried structure 180 may be buried in the second interlayer insulating layer 194. In an example embodiment, the second interlayer insulating layer 194 may cover at least a portion of the horizontal buried structure 180 and the metal-semiconductor compound pattern 190.

Figure 4A:
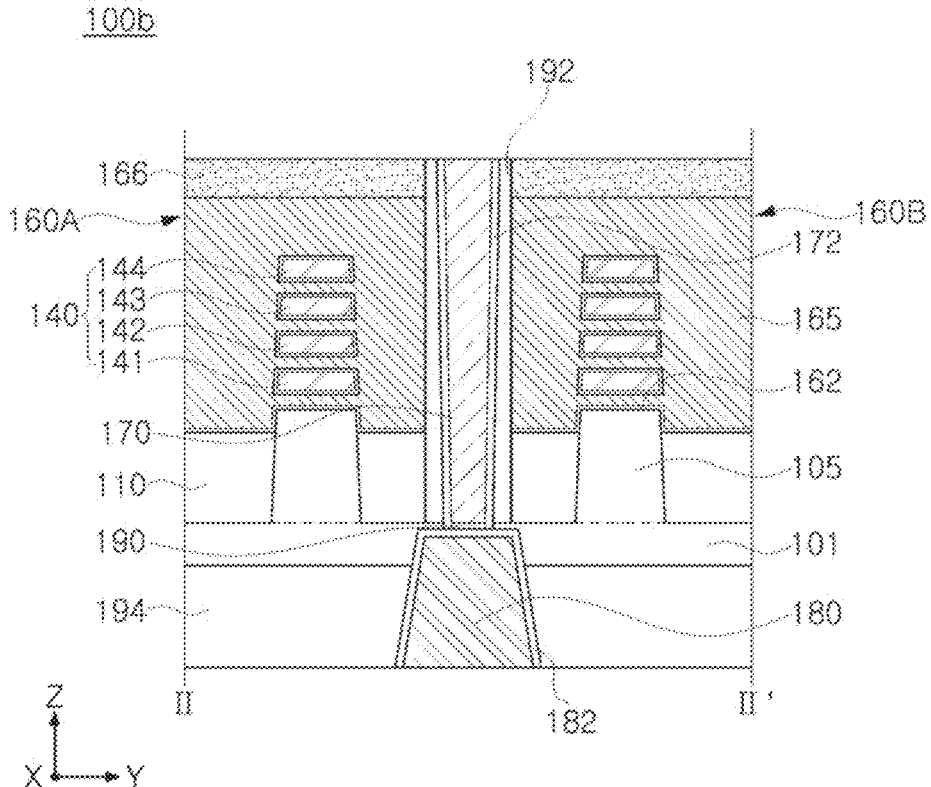
FIGS. 4A and 4B are cross-sectional diagrams illustrating a semiconductor device according to an example embodiment of the present disclosure.
Figure 4B:
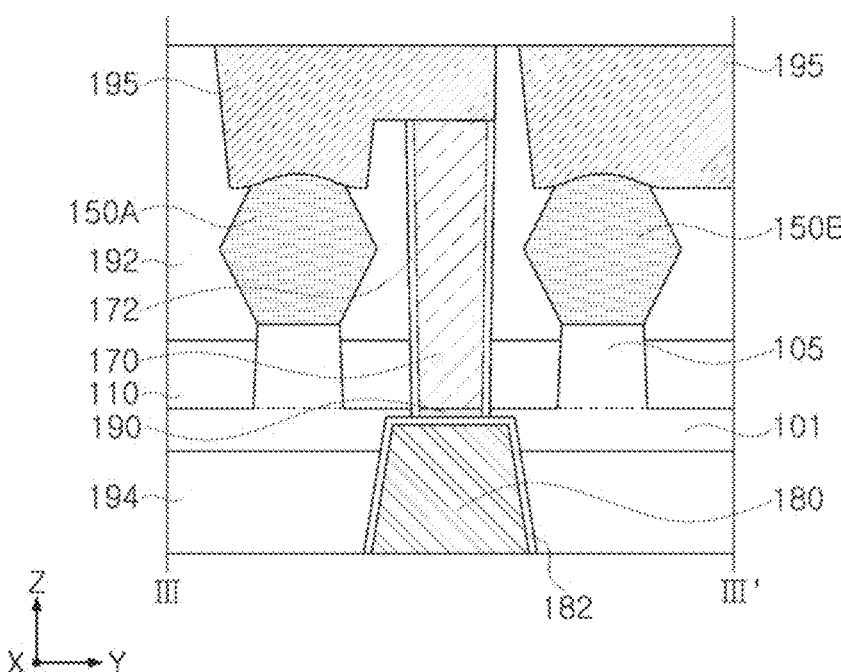

FIGS. 4A and 4B are cross-sectional diagrams illustrating a semiconductor device according to an example embodiment, illustrating cross-sections corresponding to FIGS. 2B and 2C.

Referring to FIGS. 4A and 4B, in the semiconductor device 100b, differently from the example embodiment in FIGS. 1 to 2C, the first conductive barrier 182 may be in contact with the vertical insulating layer 172. Accordingly, the metal-semiconductor compound pattern 190 may be spaced apart from the substrate 101 and/or the second interlayer insulating layer 194 by the vertical insulating layer 172. However, in the process in FIG. 22, when forming the trench BT, the metal-semiconductor compound pattern 190 may be removed such that the metal-semiconductor compound pattern 190 may not be included. Accordingly, the lower surface of the vertical buried structure 170 and the first interlayer insulating layer 192 may be in contact with the first conductive barrier 182.

Figure 5:
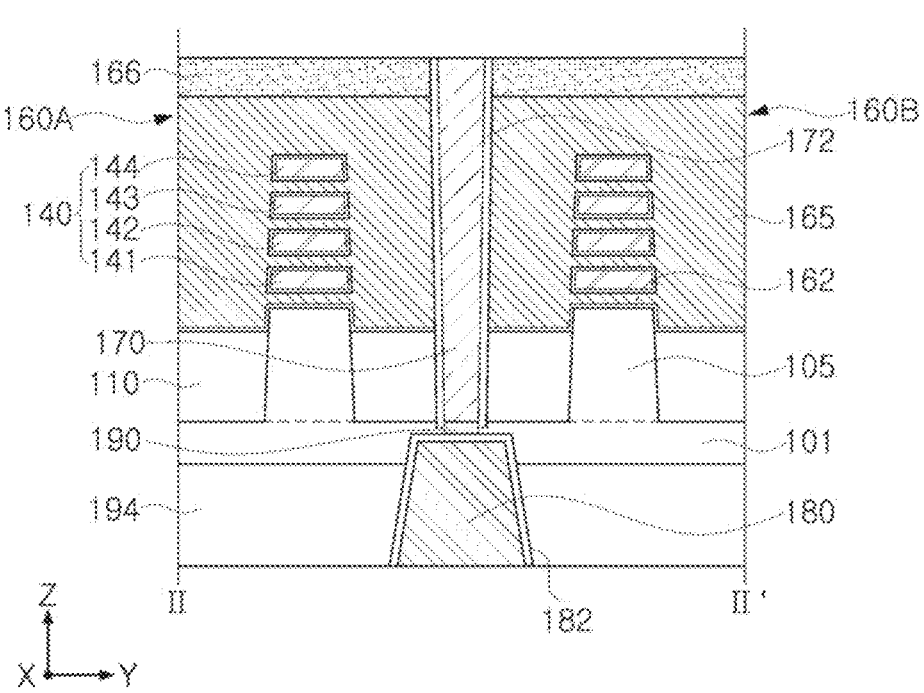
FIG. 5 is a cross-sectional diagram illustrating a semiconductor device according to an example embodiment of the present disclosure.

FIG. 5 is a cross-sectional diagram illustrating a semiconductor device according to an example embodiment, illustrating a cross-section corresponding to FIG. 2B.

Referring to FIG. 5, in the semiconductor device 100c, differently from the example embodiment in FIGS. 1 to 2C, the first interlayer insulating layer 192 may not be disposed on an external side of the vertical buried structure 170. For example, the gate electrodes 165 may contact a side surface of the vertical insulating layer 172. The vertical buried structure 170 may be electrically separated from the gate electrodes 165 of the first and second gate structures 160A and 160B by the vertical insulating layer 172.

Figure 6A:
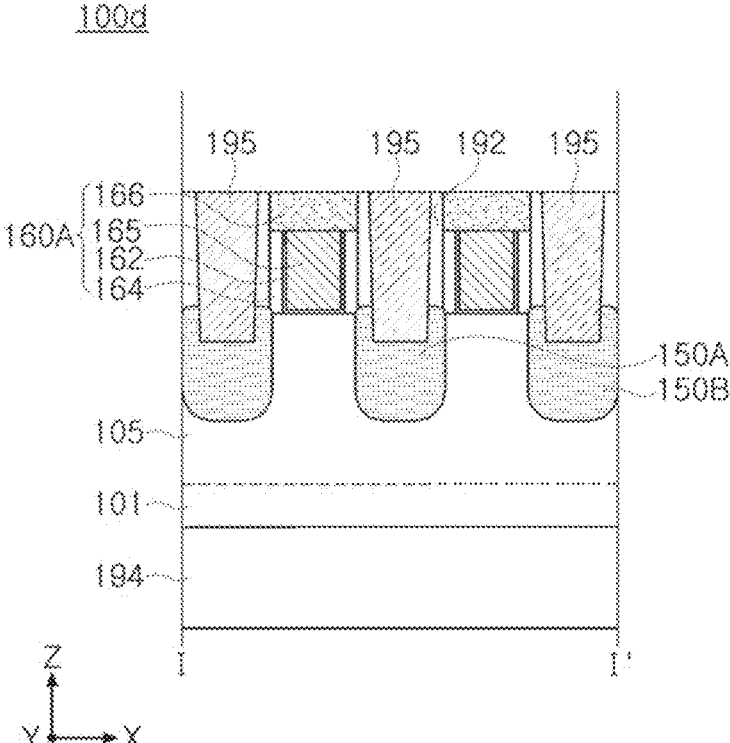
FIGS. 6A, 6B, and 6C are cross-sectional diagrams illustrating a semiconductor device according to an example embodiment of the present disclosure.
Figure 6B:
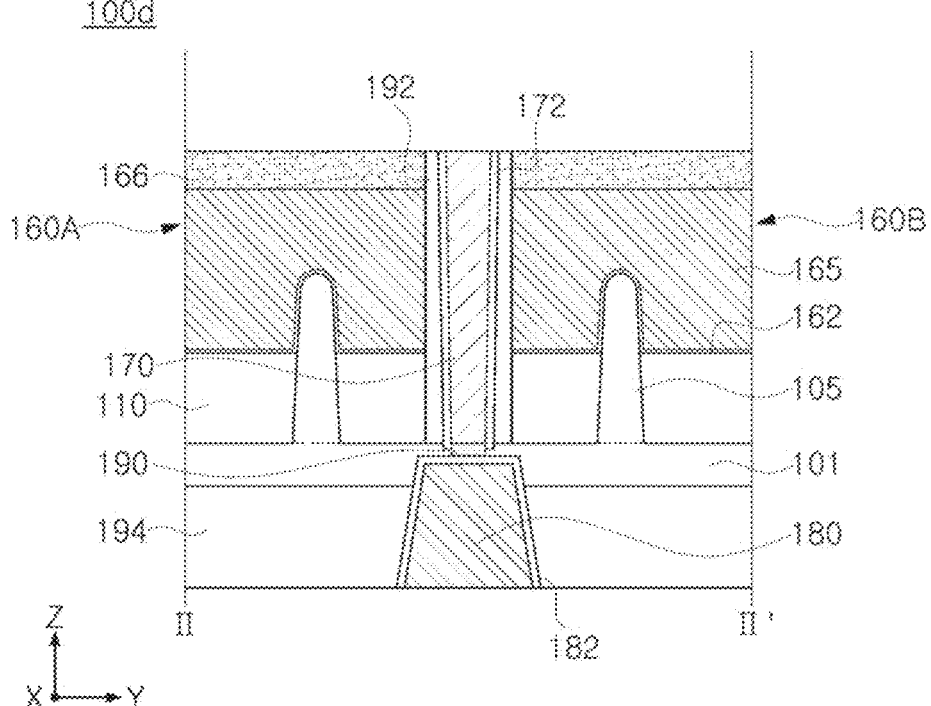
Figure 6C:
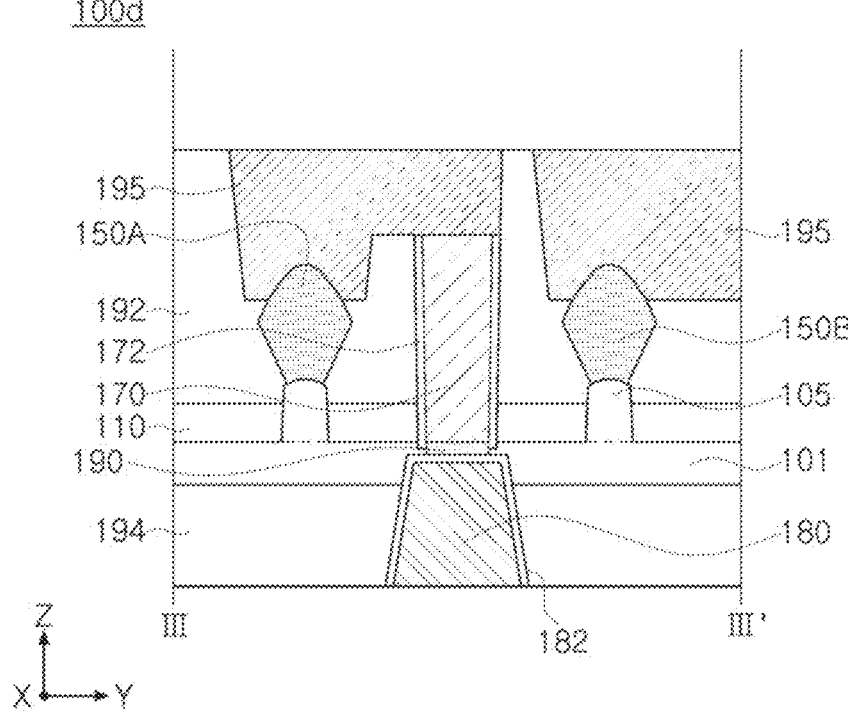

FIGS. 6A to 6C are cross-sectional diagrams illustrating a semiconductor device according to an example embodiment, illustrating cross-sections corresponding to FIGS. 2A to 2C.

Referring to FIGS. 6A to 6C, the semiconductor device 100d may not include the channel structures 140, differently from the example embodiment in FIGS. 1 to 2C, and accordingly, the arrangement of the first and second gate structures 160A and 160B may be different from the aforementioned example embodiment. The semiconductor device 100d may include FinFETs not including a channel layer.

In the semiconductor device 100d, channel regions of transistors may be limited to active regions 105 of a fin structure, which is an active structure. Also, separate channel layers may not be interposed within the gate electrodes 165. The other descriptions of the gate electrodes 165 and the vertical buried structures 170 may be the same as the descriptions of the example embodiments described with reference to FIGS. 1 to 2C. The semiconductor device 100d may be applied to other example embodiments or may be additionally disposed in one region of the semiconductor device in the other example embodiments.

In the example embodiments in FIGS. 7A to 11B described below, the vertical buried structures 170 may include first and second vertical buried structures 170A and 170B.

Figure 7A:
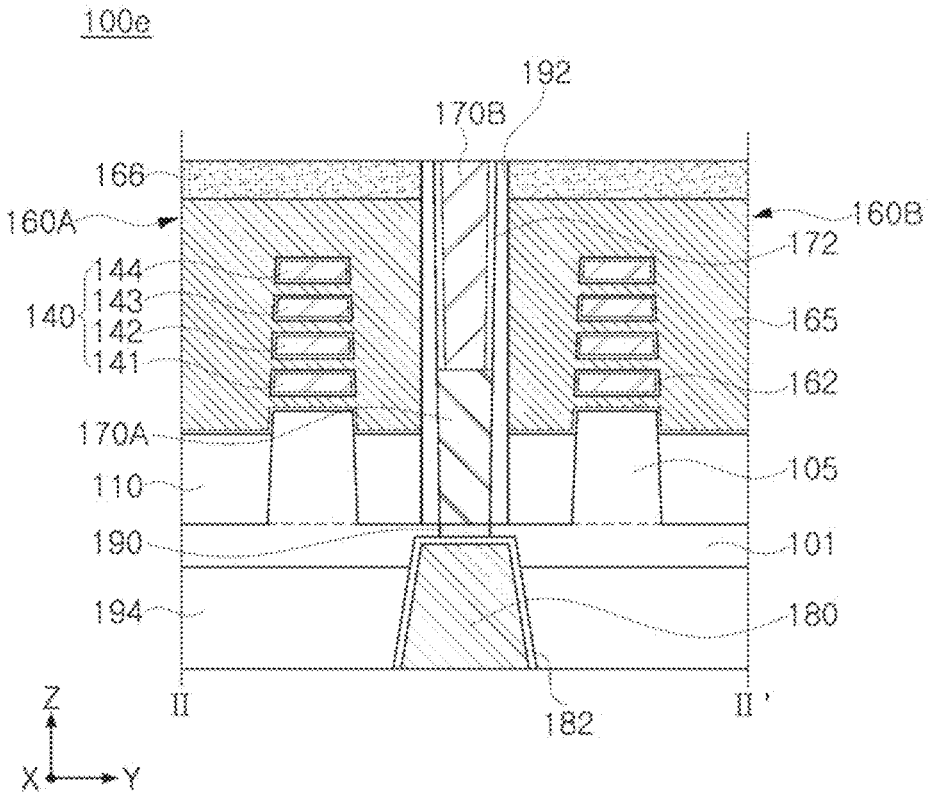
FIGS. 7A and 7B are cross-sectional diagrams illustrating a semiconductor device according to an example embodiment of the present disclosure.
Figure 7B:
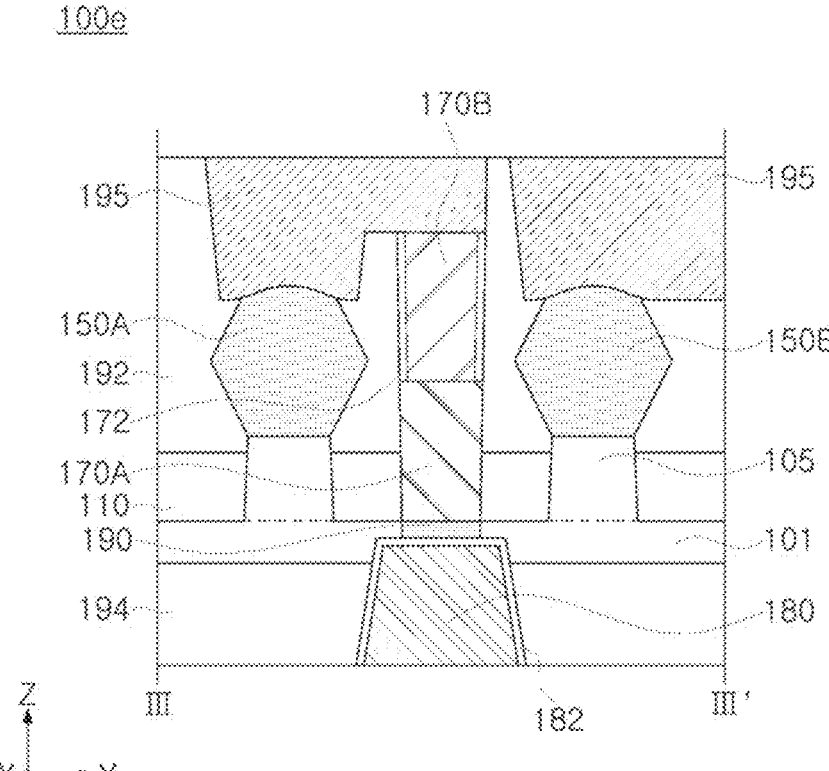

FIGS. 7A and 7B are cross-sectional diagrams illustrating a semiconductor device 100e according to an example embodiment, illustrating cross-sections corresponding to FIGS. 2B and 2C, respectively.

Referring to FIGS. 7A and 7B, the vertical buried structures 170 may include first and second vertical buried structures 170A and 170B. The first vertical buried structure 170A may penetrate at least a portion of the device isolation layer 110. The lower surface of the first vertical buried structure 170A may be disposed on a level lower than a level of the lower surfaces of the source/drain regions 150A and 150B, but an example embodiment thereof is not limited thereto, and the lower surface may be disposed on a level lower than a level of the upper and lower surfaces of the active regions 105. A lower surface of the first vertical buried structure 170A may be in contact with the first conductive barrier 182.

The second vertical buried structure 170B may be spaced apart from the gate structures 160 in the second direction Y, and may be in contact with the contact plugs 195. A lower surface of the second vertical buried structure 170B may contact an upper surface of the first vertical buried structure 170A. The upper surface or upper end of the second vertical buried structure 170B may be disposed on a level higher than a level of the upper surface or upper end of the source/drain regions 150A or 150B. The second vertical buried structure 170B may be in contact with the contact plugs 195 through the upper surface.

The first vertical buried structure 170A and the second vertical buried structure 170B may include substantially the same material, but an example embodiment thereof is not limited thereto.

In example embodiments, since the vertical insulating layer 172 may be formed on the first vertical buried structure 170A after the first vertical buried structure 170A is formed, the vertical insulating layer 172 may be disposed on a level higher than a level of the first vertical buried structure 170A.

The upper surface of the first vertical buried structure 170A and the lower surface of the second vertical buried structure 170B may be disposed on a level higher than a level of the lower surface of the gate electrode 165 in FIG. 7A, but an example embodiment thereof is not limited thereto. As another example embodiment, the upper surface of the first vertical buried structure 170A and the lower surface of the second vertical buried structure 170B may be disposed on a level lower than a point at which the gate dielectric layer 162 and the device isolation layer 110 are in contact with each other. In an example embodiment, the lowermost portion of the vertical insulating layer 172 may be disposed on a level lower than a level of the lowermost portions of the first and second gate structures 160A and 160B.

In an example embodiment, the upper surface of the first vertical buried structure 170A and the lower surface of the second vertical buried structure 170B may be disposed on substantially the same level as a level of a portion in which widths of the first and second source/drain regions 150A and 150B in the second direction Y is the largest, or may be disposed on a level lower than the level of the portion. In an example embodiment, the lowermost portion of the vertical insulating layer 172 may be disposed on substantially the same level as a level of a portion in which widths of the first and second source/drain regions 150A and 150B in the second direction Y is the largest, or may be disposed on a level lower than the level of the portion, but an example embodiment thereof is not limited thereto.

The vertical insulating layer 172 may formed on the second vertical buried structure 170B, and may not be formed on the first vertical buried structure 170A. For example, the vertical insulating layer 172 may contact a side surface of the second vertical buried structure 170B and an upper surface of the first vertical buried structure 170A. In example embodiments, upper surfaces of the vertical insulating layer 172 and the second vertical buried structure 170B may be coplanar with one another, and lower surfaces of the vertical insulating layer 172 and the second vertical buried structure 170B may be coplanar with one another.

Figure 8A:
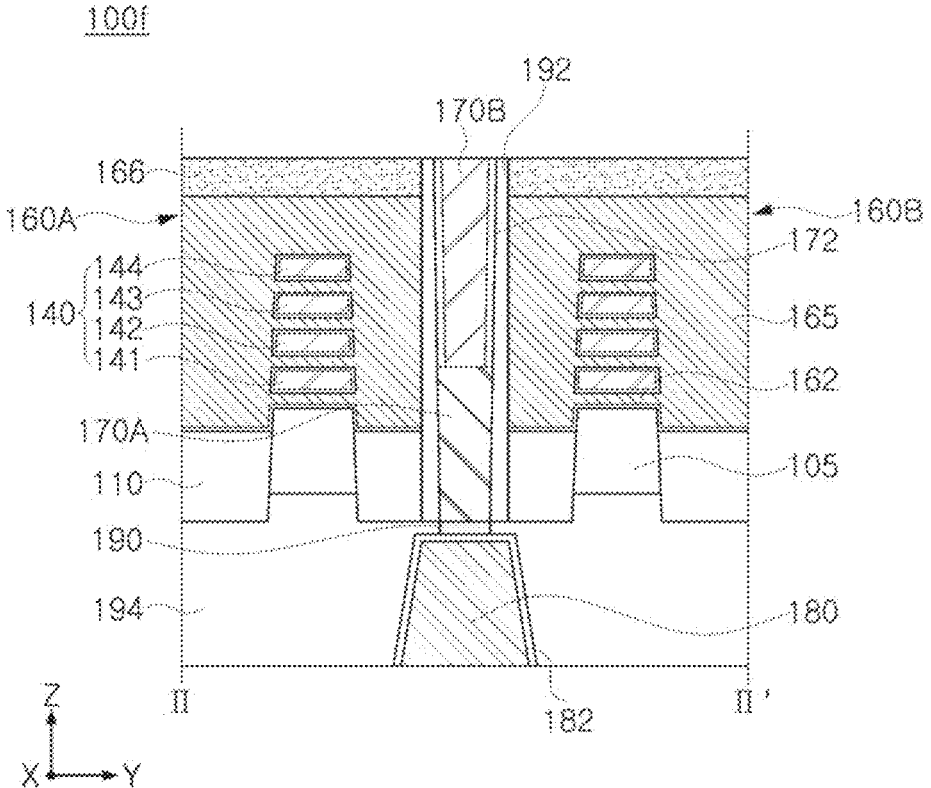
Figure 8B:
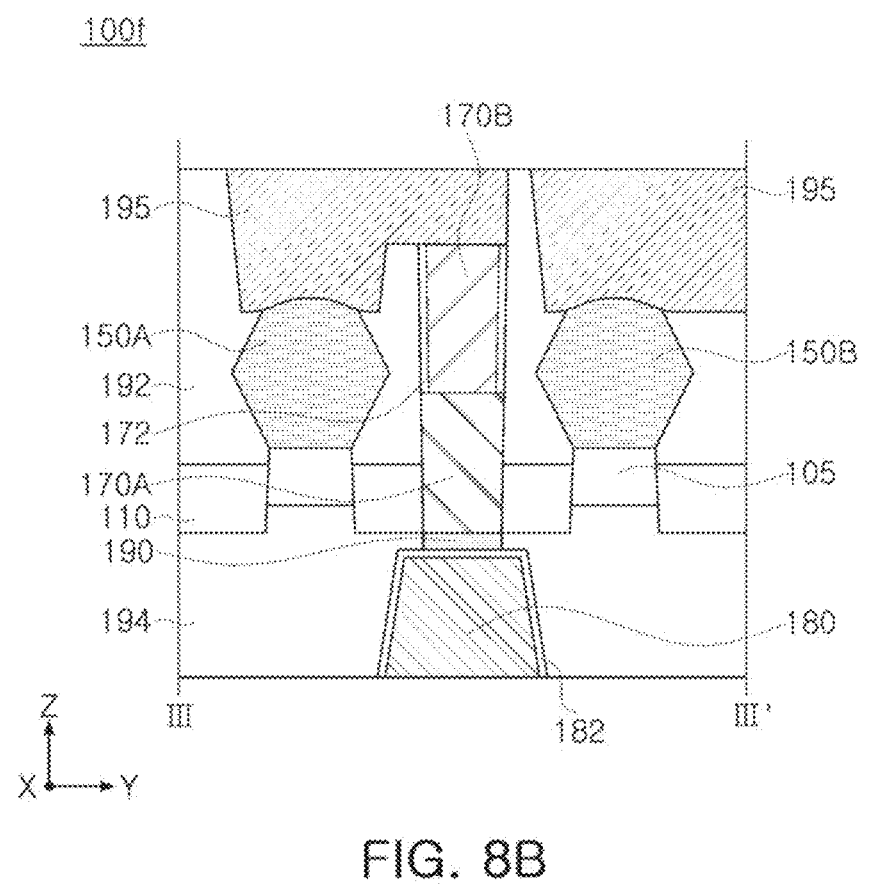

FIGS. 8A and 8B are cross-sectional diagrams illustrating a semiconductor device according to an example embodiment, illustrating cross-sections corresponding to FIGS. 2B and 2C, respectively.

Referring to FIGS. 8A and 8B, other than the first vertical buried structure 170A and the second vertical buried structure 170B, the semiconductor device may be configured substantially the same as the semiconductor device 100a in FIGS. 3A to 3C described above.

Figure 9A:
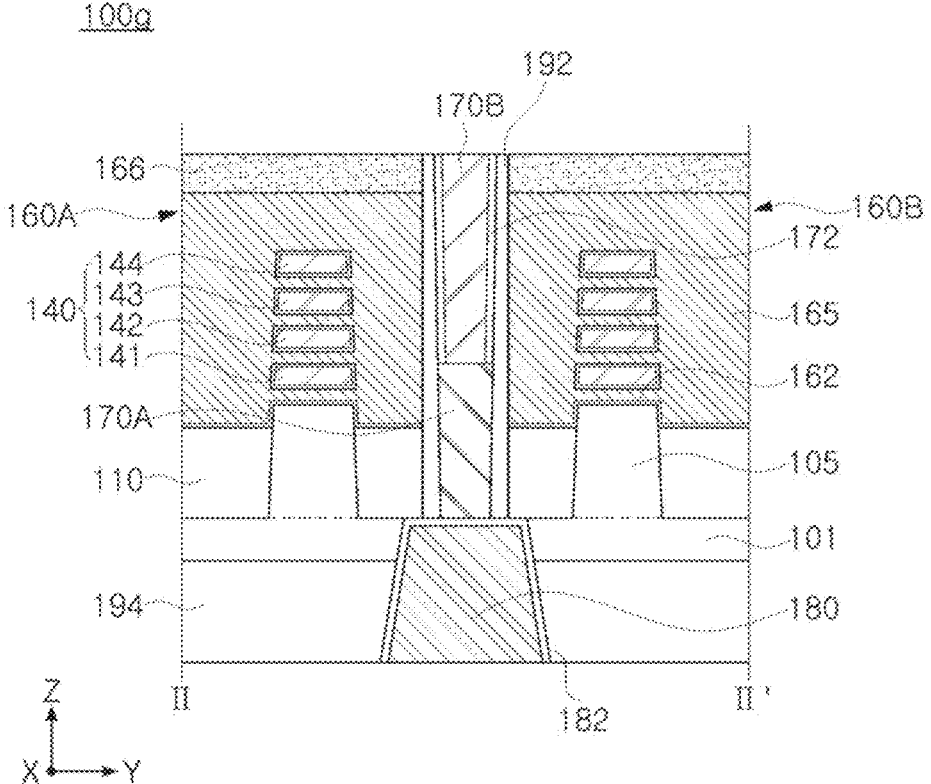
FIGS. 9A and 9B are cross-sectional diagrams illustrating a semiconductor device according to an example embodiment of the present disclosure.
Figure 9B:
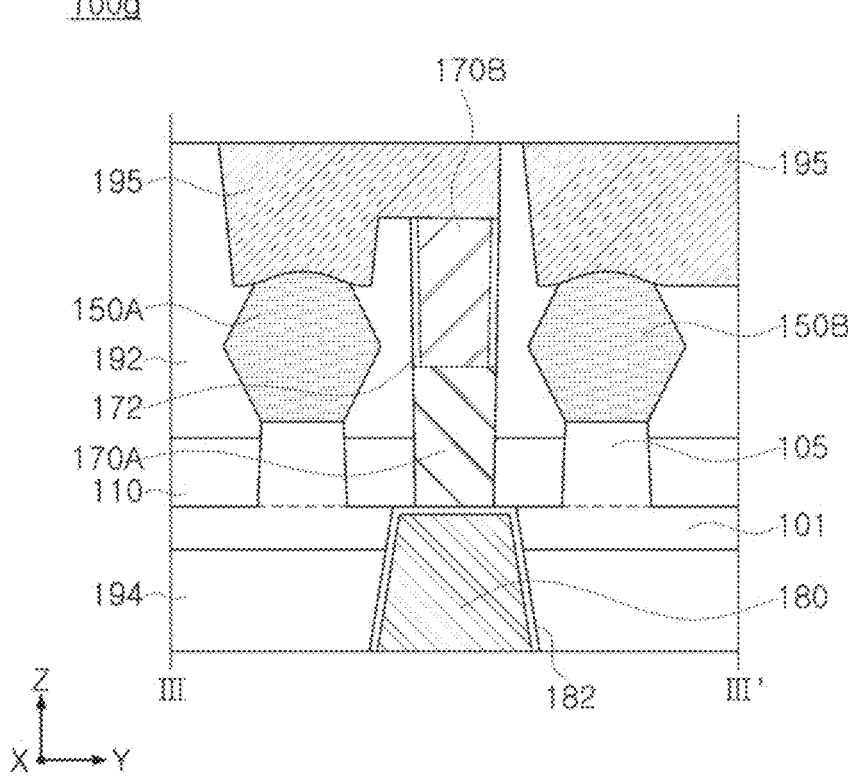

FIGS. 9A and 9B are cross-sectional diagrams illustrating a semiconductor device 100g according to an example embodiment, illustrating cross-sections corresponding to FIGS. 2B and 2C, respectively.

Referring to FIGS. 9A and 9B, the semiconductor device 100g may not include the metal-semiconductor compound pattern 190, differently from the example embodiments in FIGS. 1 to 2C. Accordingly, the lower surface of the vertical buried structure 170 and the first interlayer insulating layer 192 may be in contact with the first conductive barrier 182. For example, an upper surface of the first conductive barrier 182 may be coplanar with an upper surface of the substrate 101. The semiconductor device 100g in FIGS. 9A and 9B may be manufactured by a process of forming the vertical buried structure 170 and the vertical insulating layer 172 in order without performing a process of forming the metal-semiconductor compound pattern 190 in the process in FIG. 19. Accordingly, resistance of the vertical buried structure 170 may be higher as pared to the example embodiments in FIGS. 1 to 2C in which the vertical buried structure 170 is formed after the metal-semiconductor compound pattern 190 is formed.

Figure 10:
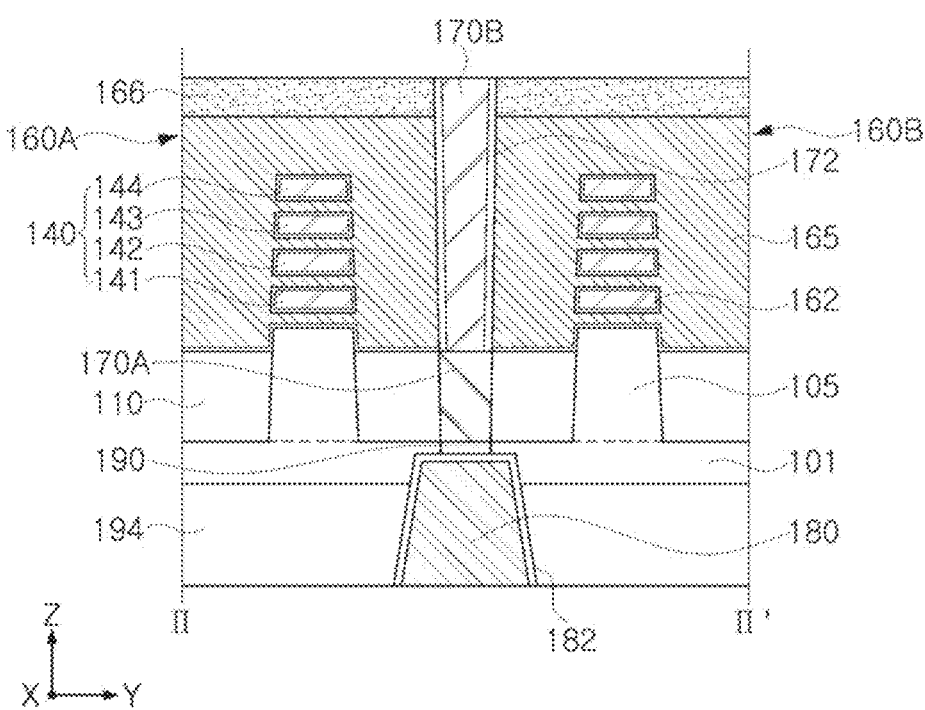
FIG. 10 is a cross-sectional diagram illustrating a semiconductor device according to an example embodiment of the present disclosure.

FIG. 10 is a cross-sectional diagram illustrating a semiconductor device 100h according to an example embodiment, illustrating cross-sections corresponding to FIG. 2B.

Referring to FIG. 10, the first interlayer insulating layer 192 may not be disposed on an external side of the first and second vertical buried structures 170A and 170B. Also, the semiconductor device 100h may be configured substantially the same as the semiconductor device 100c in FIG. 5 described above.

Figure 11A:
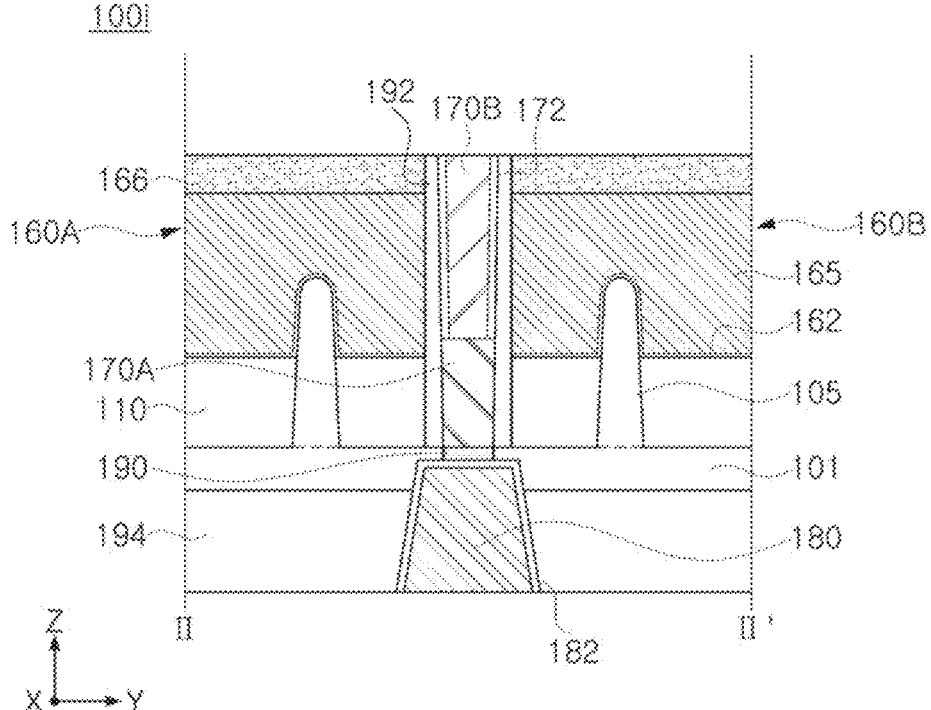
FIGS. 11A and 11B are cross-sectional diagrams illustrating a semiconductor device according to an example embodiment of the present disclosure.
Figure 11B:
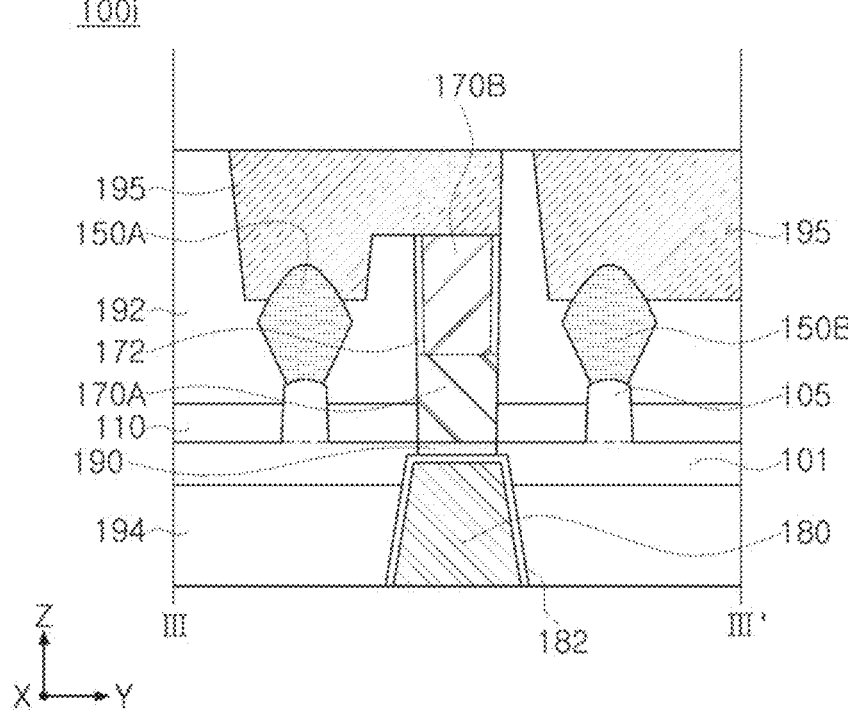

FIGS. 11A and 11B are cross-sectional diagrams illustrating a semiconductor device 100i according to an example embodiment, illustrating cross-sections corresponding to FIGS. 2B and 2C, respectively.

Referring to FIGS. 11A and 11B, other than the first vertical buried structure 170A and the second vertical buried structure 170B, the semiconductor device 100i may be configured substantially the same as the semiconductor device 100d in FIGS. 6A to 6C.

Figure 12A:
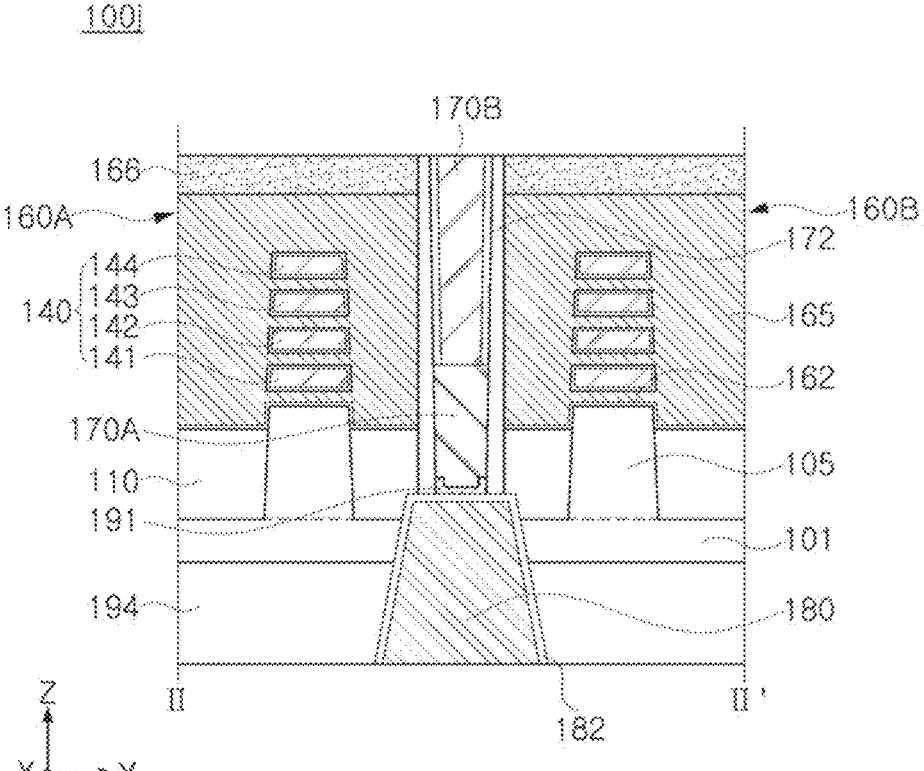
FIGS. 12A and 12B are cross-sectional diagrams illustrating a semiconductor device according to an example embodiment of the present disclosure.
Figure 12B:
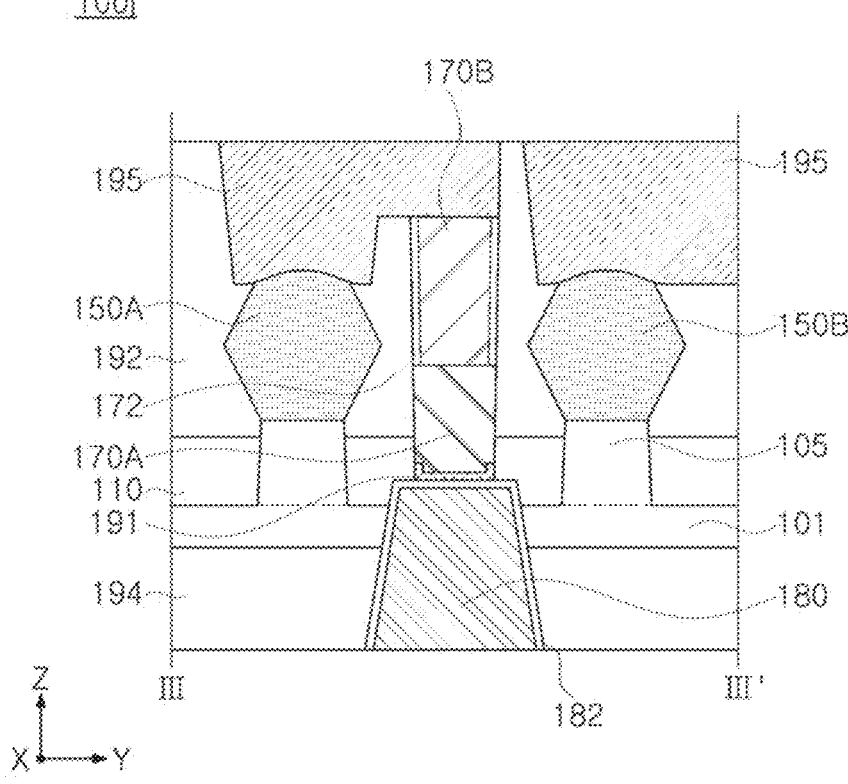

FIGS. 12A and 12B are cross-sectional diagrams illustrating a semiconductor device 100j according to an example embodiment, illustrating cross-sections corresponding to FIGS. 2B and 2C, respectively.

Referring to FIGS. 12A and 12B, the semiconductor device 100j may not include the metal-semiconductor compound pattern 190 differently from the example embodiments in FIGS. 7A and 7B. Accordingly, a second conductive barrier 191 disposed below the vertical buried structure 170A and on the first conductive barrier 182 may be further included. The second conductive barrier 191 may be in contact with the first vertical buried structure 170A and the first conductive barrier 182.

In the example embodiment in FIGS. 7A and 7B, at least a portion of the metal-semiconductor compound pattern 190 may be disposed within the substrate 101, whereas in the example embodiment in FIGS. 12A and 12B, the second conductive barrier 191 may be disposed above the upper surface of the substrate 101. For example, an upper surface of the first conductive barrier 182 may be at a vertical level higher than an upper surface of the substrate 101, and the second conductive barrier 191 may contact the upper surface of the first conductive barrier 182. In addition, a lower surface of the first interlayer insulating layer 192 may contact the upper surface of the first conductive barrier 182. In an example embodiment, a lowermost portion of the first vertical buried structure 170A may be disposed within the device isolation layer 110. The second conductive barrier 191 may have a shape with an inwardly recessed center. For example, the second conductive barrier 191 may be u-shaped. The second conductive barrier 191 may include substantially the same material as that of the first conductive barrier 182, but an example embodiment thereof is not limited thereto. The second conductive barrier 191 may include, for example, at least one of titanium nitride (TiN), tantalum nitride (TaN), molybdenum nitride (MoN), tungsten nitride (WN), titanium (Ti), molybdenum (Mo), and tantalum (Ta), but an example embodiment thereof is not limited thereto.

Figure 12C:
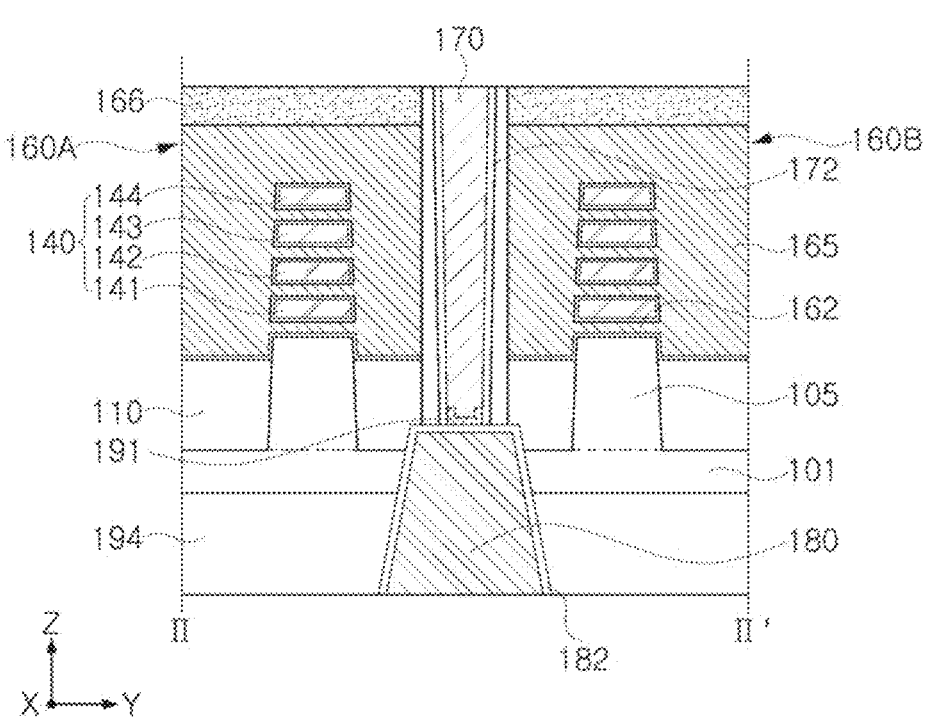
FIGS. 12C and 12D are cross-sectional diagrams illustrating a semiconductor device according to an example embodiment of the present disclosure.
Figure 12D:
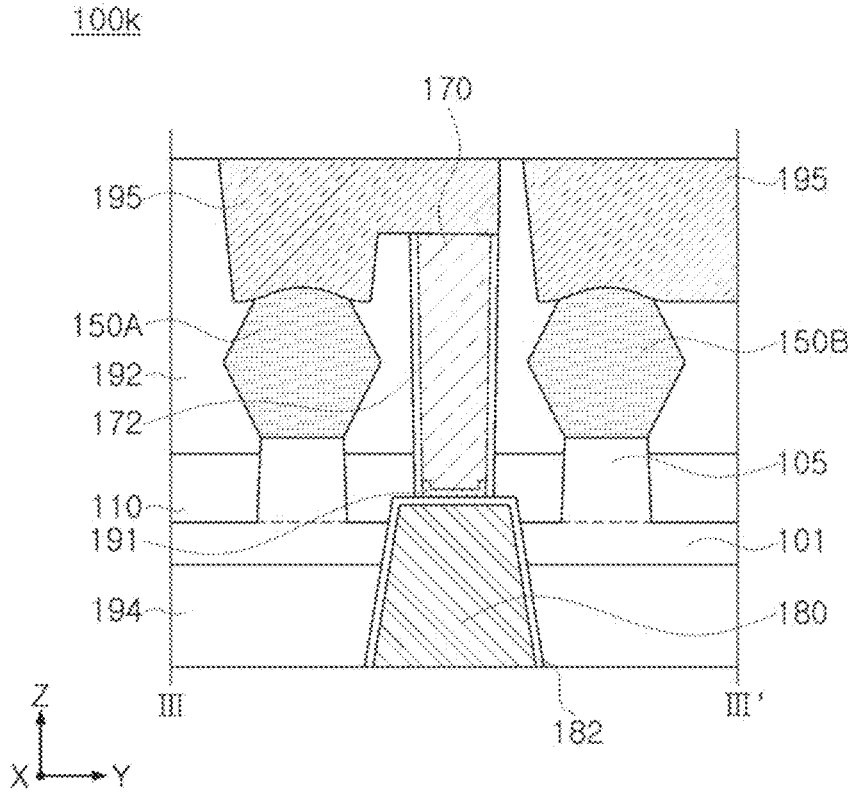

FIGS. 12C and 12D are cross-sectional diagrams illustrating a semiconductor device according to an example embodiment, illustrating cross-sections corresponding to FIGS. 2B and 2C, respectively. In the description below, descriptions duplicating the description described with reference to FIGS. 12A and 12B will not be provided.

Referring to FIGS. 12C and 12D, in the semiconductor device 100k, the vertical insulating layer 172 may be in contact with the first conductive barrier 182 and the second conductive barrier 191. Also, the vertical insulating layer 172 may cover the entire external side surface of the vertical buried structure 170. Since the vertical insulating layer 172 is formed earlier than the second conductive barrier 191, an external side surface of the second conductive barrier 191 may be in contact with the vertical insulating layer 172. A lower surface of the second conductive barrier 191 may be in contact with an upper surface of the first conductive barrier 182.

FIGS. 13A to 22 are diagrams illustrating processes of a method of manufacturing a semiconductor device in order according to an example embodiment. For example, FIGS. 13A to 22 are diagrams illustrating an example of a method of manufacturing the semiconductor device in FIGS. 1 to 2C. FIGS. 13A, 14A, 15A, 16A, and 17A illustrate cross-sections corresponding to FIG. 2A, FIGS. 13B, 14B, 15B, 16B, and 17B illustrate cross-sections corresponding to FIG. 2B, and FIGS. 13C, 14C, 15C, 16C, 17C, and 18 to 22 illustrate cross-sections corresponding to FIG. 2C.

Figure 13A:
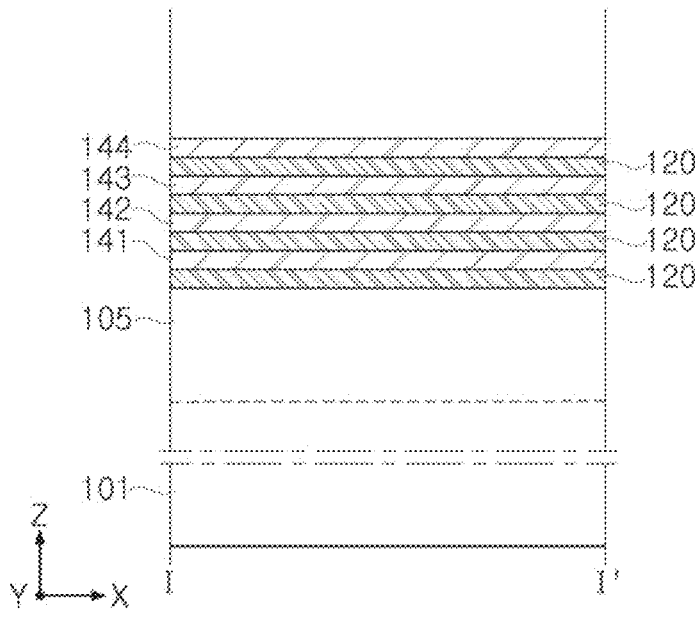
FIGS. 13A, 13B, 13C, 14A, 14B, 14C, 15A, 15B, 15C, 16A, 16B, 16C, 17A, 17B, 17C, 18, 19, 20, 21, and 22 are diagrams illustrating processes of a method of manufacturing a semiconductor device in order according to an example embodiment of the present disclosure.
Figure 13B:
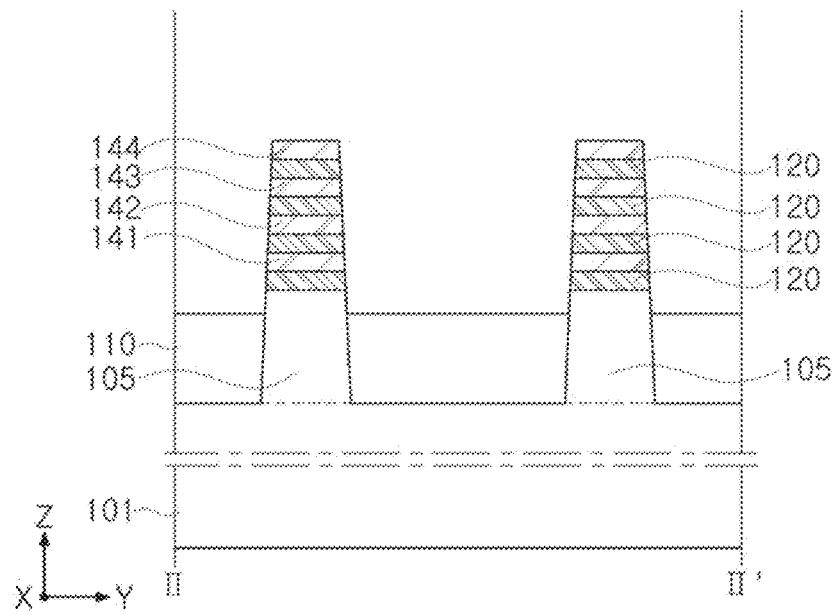
Figure 13C:
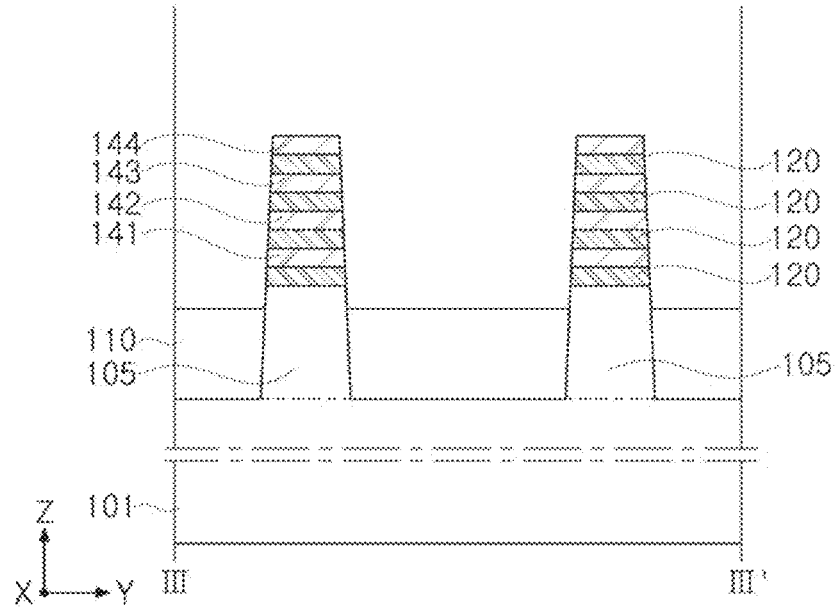

Referring to FIGS. 13A to 13C, sacrificial layers 120 and first to fourth channel layers 141, 142, 143, and 144 may be alternately stacked on a substrate 101, and active structures including active regions 105 may be formed.

The sacrificial layers 120 may be replaced with the gate dielectric layers 162 and the gate electrode 165 disposed below the fourth channel layer 144 through subsequent processes, as illustrated in FIGS. 2A and 2B. The sacrificial layers 120 may be formed of a material having etch selectivity with respect to the first to fourth channel layers 141, 142, 143, and 144. The first to fourth channel layers 141, 142, 143, and 144 may include a material different from that of the sacrificial layers 120. The sacrificial layers 120 and the first to fourth channel layers 141, 142, 143, and 144 may include, for a semiconductor material including at least one of silicon germanium (SiGe) and germanium (Ge), and may include different materials, and may or may not include impurities. For example, the sacrificial layers 120 may include silicon germanium (SiGe), and the first to fourth channel layers 141, 142, 143, and 144 may include silicon (Si).

The sacrificial layers 120 and the first to fourth channel layers 141, 142, 143, and 144 may be formed by performing an epitaxial growth process on the substrate 101. Each of the sacrificial layers 120 and the first to fourth channel layers 141, 142, 143, and 144 may have a thickness ranging from about 1 Å to about 100 nm. The number of layers of the channel layers 141, 142, 143, and 144 alternately stacked with the sacrificial layers 120 may be varied in example embodiments.

Thereafter, the active structures may be formed by patterning the sacrificial layers 120, the first to fourth channel layers 141, 142, 143, and 144, and an upper region of the substrate 101. The active structures may include sacrificial layers 120 and first to fourth channel layers 141, 142, 143, and 144 alternately stacked with each other, and may further include active regions 105 formed to protrude from the substrate 101 by removing a portion of the substrate 101. The active structures may be formed in a line shape extending lengthwise in one direction, for example, the X-direction, and may be spaced apart from each other in the Y-direction. Depending on the aspect ratio, the side surfaces of the active structures may have an inclined shape such that a width may increase downwardly.

A device isolation layer 110 may be formed in a region from which a portion of the substrate 101 is removed by filling an insulating material and partially removing the insulating material such that the active regions 105 may protrude. An upper surface of the device isolation layer 110 may be disposed on a level lower than a level of upper surfaces of the active regions 105.

Figure 14A:
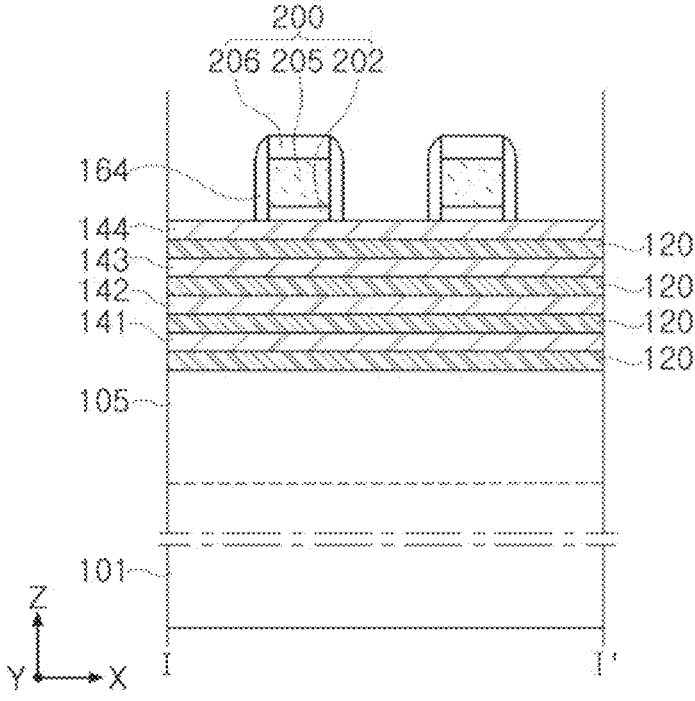
Figure 14B:
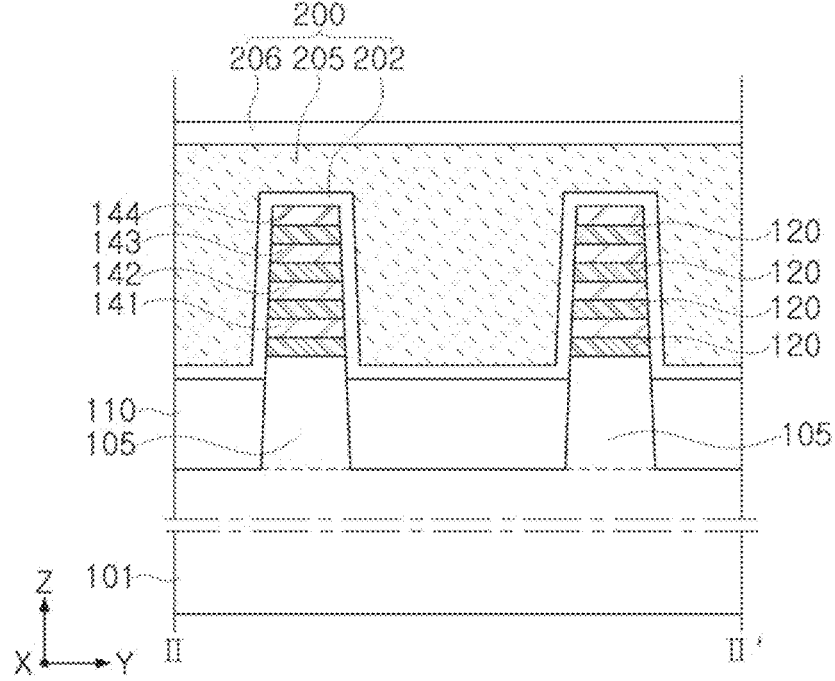
Figure 14C:
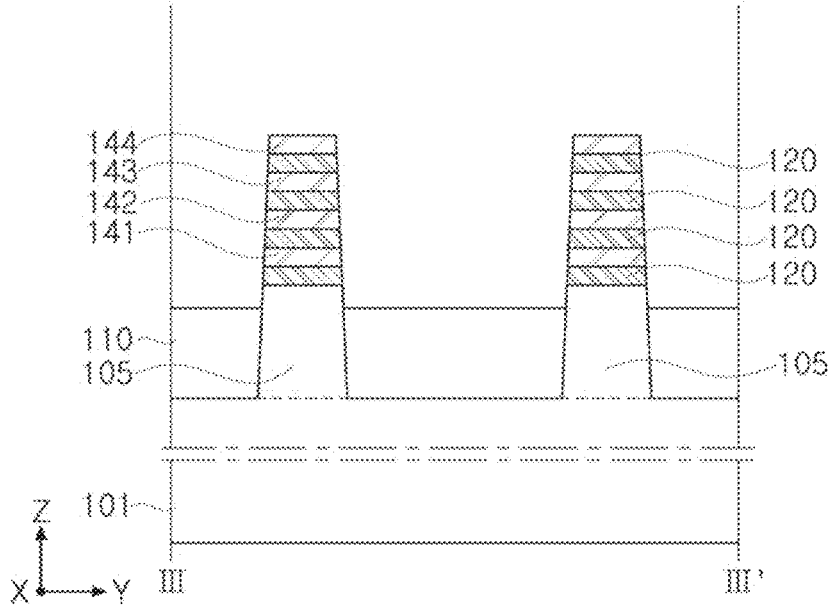

Referring to FIGS. 14A to 14C, a sacrificial gate structure 200 and gate spacer layers 164 may be formed on the active structures.

The sacrificial gate structures 200 may be a sacrificial structure formed in the region in which the gate dielectric layer 162 and the gate electrode 165 are disposed on the channel structures 140 through a subsequent process as illustrated in FIGS. 2A and 2B. The sacrificial gate structures 200 may have a line shape intersecting the active structures and extending lengthwise in one direction. The sacrificial gate structures 200 may extend lengthwise in the Y-direction and may be spaced apart from each other in the X-direction.

The sacrificial gate structure 200 may include first and second sacrificial gate layers 202 and 205 and a mask pattern layer 206 stacked in order. The first and second sacrificial gate layers 202 and 205 may be patterned using the mask pattern layer 206. The first and second sacrificial gate layers 202 and 205 may be an insulating layer and a conductive layer, respectively, but an example embodiment thereof is not limited thereto, and the first and second sacrificial gate layers 202 and 205 may be integrated as a single layer. For example, the first sacrificial gate layer 202 may include silicon oxide, and the second sacrificial gate layer 205 may include polysilicon. The mask pattern layer 206 may include silicon oxide and/or silicon nitride.

Gate spacer layers 164 may be formed on both sidewalls of the sacrificial gate structures 200. The gate spacer layers 164 may be formed of a low-κ material, and may include, for example, at least one of SiO, SiN, SiCN, SiOC, SiON, and SiOCN.

Figure 15A:
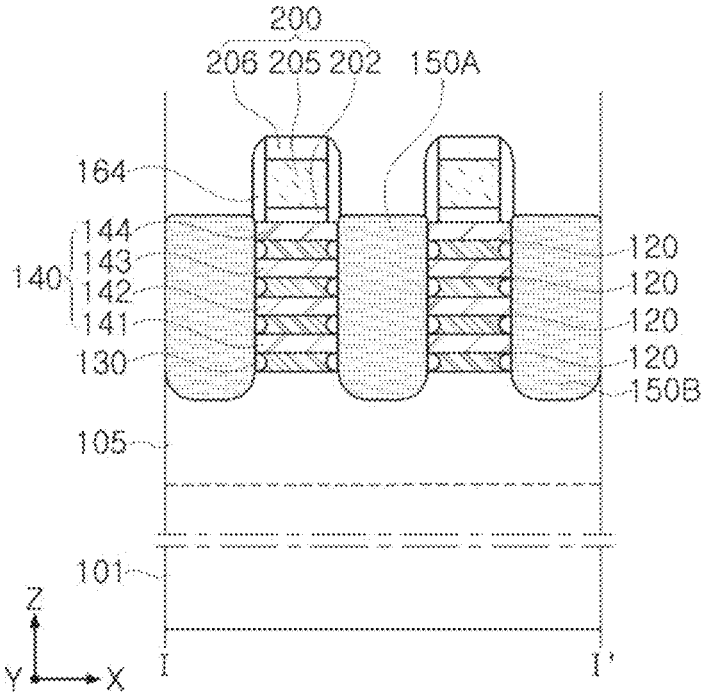
Figure 15B:
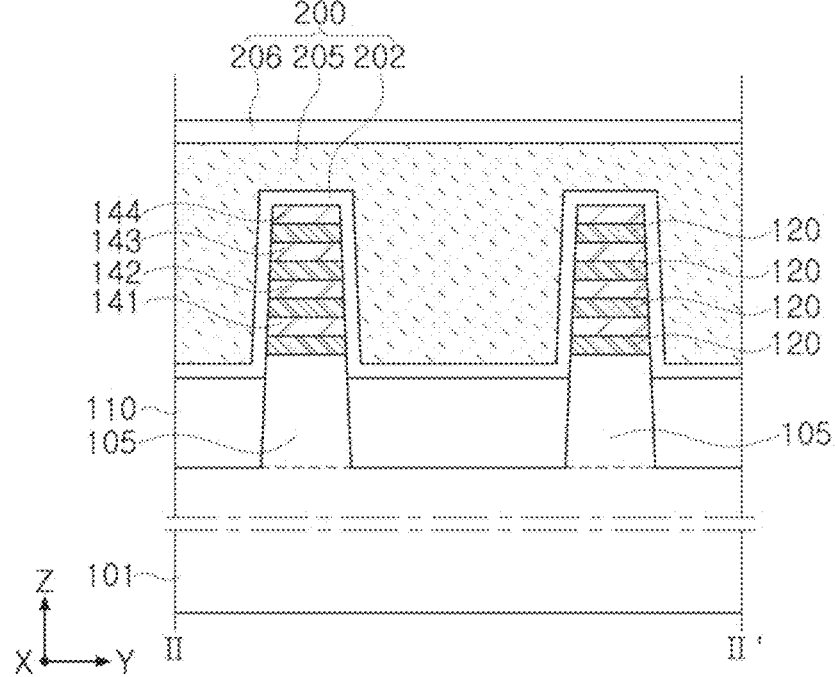
Figure 15C:
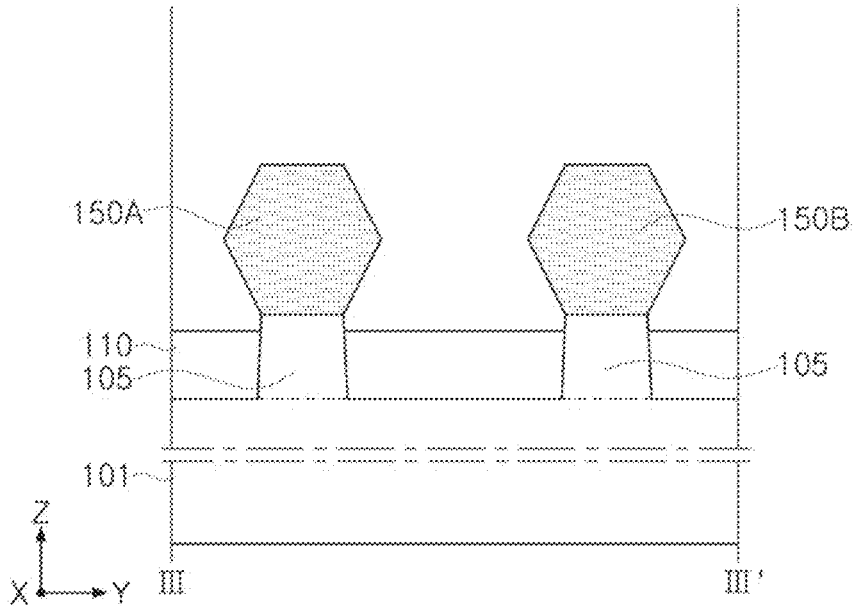

Referring to FIGS. 15A to 15C, a portion of the exposed sacrificial layers 120 and the first to fourth channel layers 141, 142, 143, and 144 may be removed from a region between the sacrificial gate structures 200, and internal spacer layers 130 and first and second source/drain regions 150A and 150B may be formed.

First, recess regions may be formed by removing a portion of the exposed sacrificial layers 120 and the first to fourth channel layers 141, 142, 143, and 144 using the sacrificial gate structures 200 and the gate spacer layers 164 as a mask. In this process, the first to fourth channel layers 141, 142, 143, and 144 may form channel structures 140 having a limited length in the X-direction.

Thereafter, the sacrificial layers 120 exposed through the recess regions may be partially removed from the side surfaces. The sacrificial layers 120 may be selectively etched with respect to the channel structures 140 by, for example, a wet etching process, and may be removed from a side surface in the X-direction to a predetermined depth. The sacrificial layers 120 may have side surfaces inwardly rounded due to the etching of the side surface as described above. However, the shapes of the side surfaces of the sacrificial layers 120 are not limited to the illustrated examples.

The internal spacer layers 130 may be formed by filling an insulating material in a region from which the sacrificial layers 120 are removed and removing the insulating material deposited on an external side of the channel structures 140. The internal spacer layers 130 may be formed of the same material as that of the gate spacer layers 164, but an example embodiment thereof is not limited thereto. For example, the internal spacer layers 130 may include at least one of SiN, SiCN, SiOCN, SiBCN, and SiBN.

The first and second source/drain regions 150A and 150B may be formed by being grown from side surfaces of the active regions 105 and the channel structures 140, for example, by a selective epitaxial process. The first and second source/drain regions 150A and 150B may include impurities by in-situ doping and may include a plurality of layers having different doping elements and/or doping concentrations.

Figure 16A:
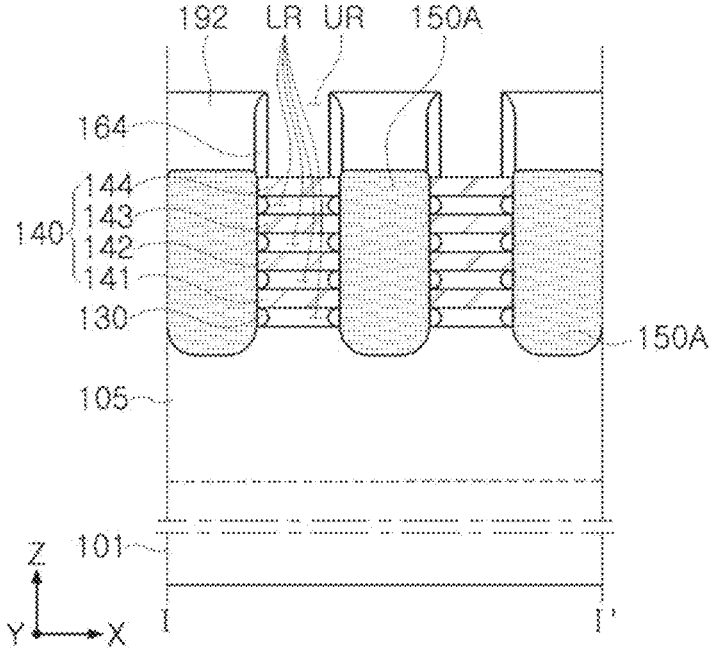
Figure 16B:
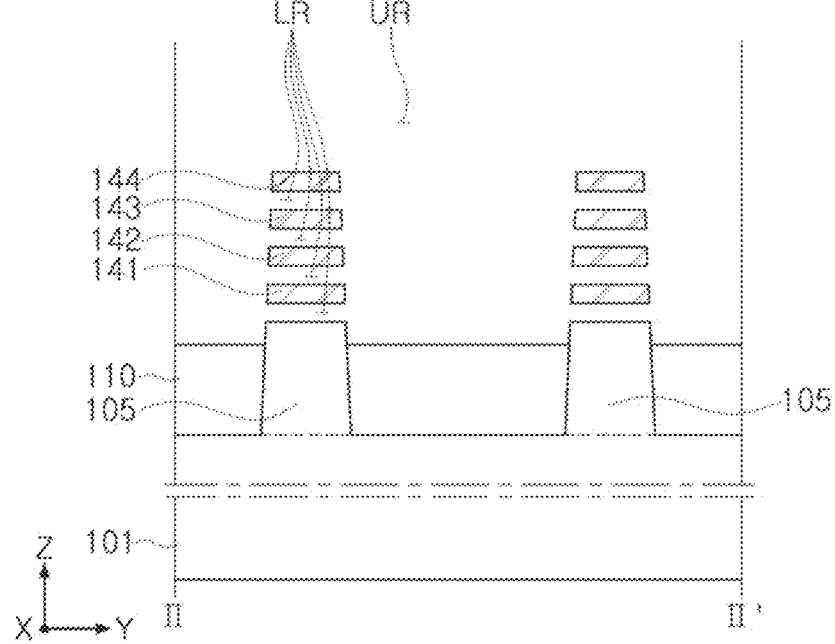
Figure 16C:
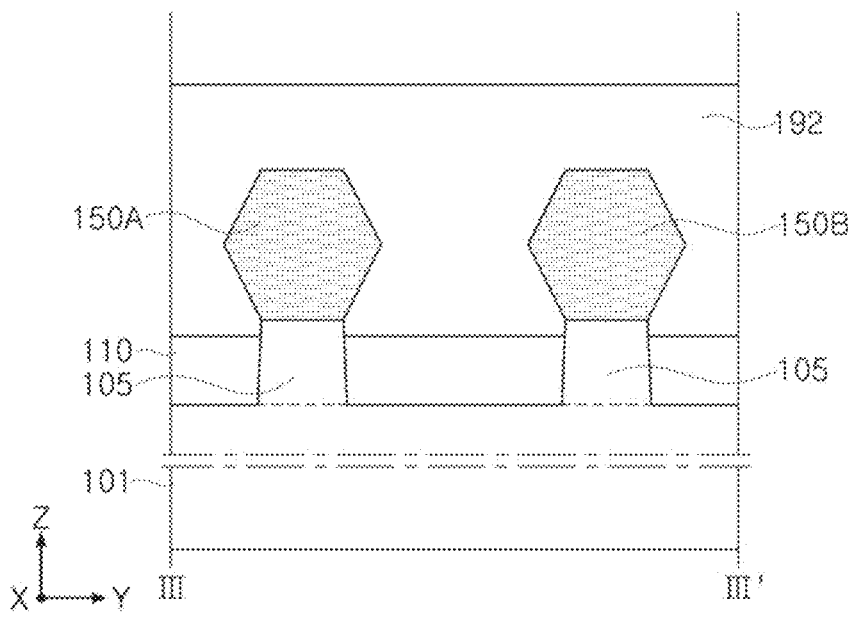

Referring to FIGS. 16A to 16C, a first interlayer insulating layer 192 may be formed, and the sacrificial layers 120 and the sacrificial gate structures 200 may be removed.

The first interlayer insulating layer 192 may be formed by forming an insulating film covering the sacrificial gate structures 200 and the first and second source/drain regions 150A and 150B and performing a planarization process.

The sacrificial layers 120 and the sacrificial gate structures 200 may be selectively removed with respect to the gate spacer layers 164, the first interlayer insulating layer 192, the channel structures 140, and the internal spacer layers 130. First, the upper gap regions UR may be formed by removing the sacrificial gate structures 200, and lower gap regions LR may be formed by removing the sacrificial layers 120 exposed through the upper gap regions UR. During the removing process, the first and second source/drain regions 150A and 150B may be protected by the first interlayer insulating layer 192 and the internal spacer layers 130.

Figure 17A:
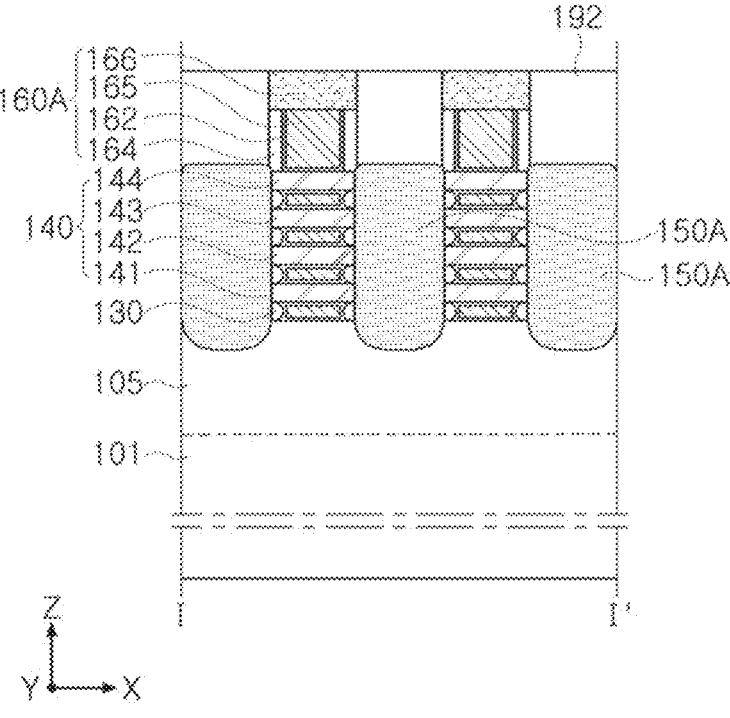
Figure 17B:
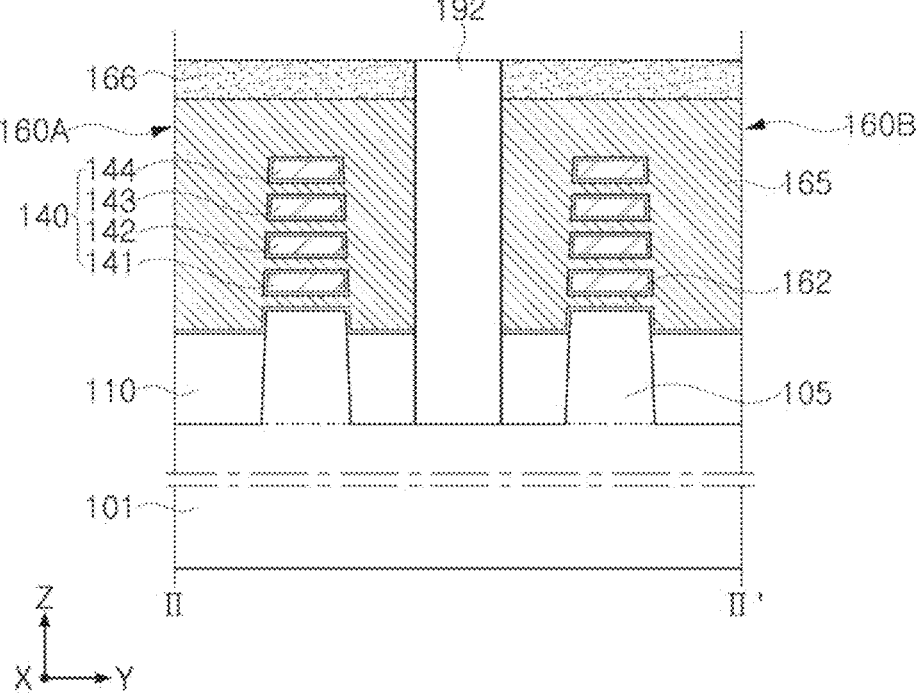
Figure 17C:
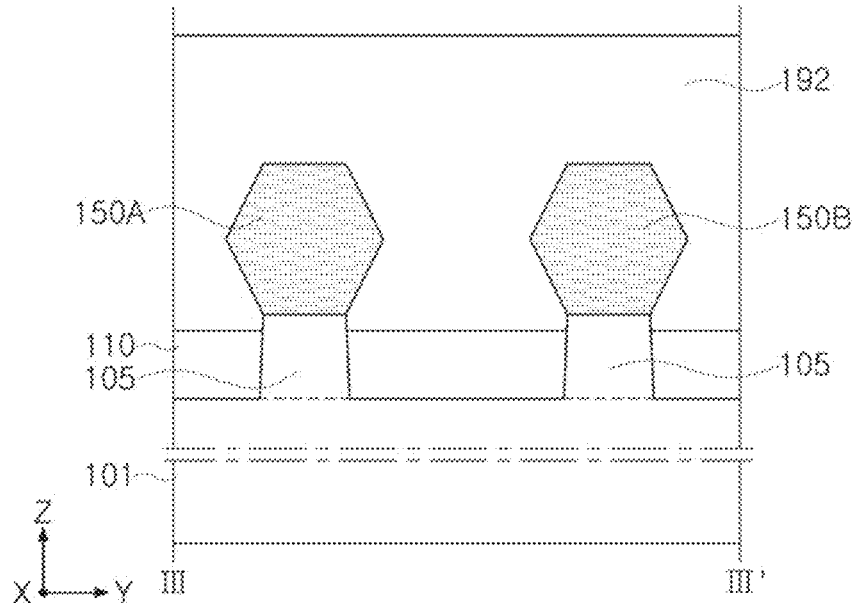

Referring to FIGS. 17A to 17C, first and second gate structures 160A and 160B may be formed by forming gate dielectric layers 162 and a gate electrode 165.

The gate dielectric layers 162 and the gate electrode 165 may be formed to fill the upper gap regions UR and lower gap regions LR. The gate dielectric layers 162 may be formed to conformally cover internal surfaces of the upper gap regions UR and the lower gap regions LR. The gate electrode 165 may be, after forming the upper gap regions UR and the lower gap regions LR to be completely buried, removed from the upper portion to a predetermined depth from the upper gap regions UR together with the gate dielectric layers 162 and the gate spacer layers 164. A gate capping layer 166 may be formed in a region from which the gate electrode 165 and the gate spacer layers 164 are removed in the upper gap regions UR. Accordingly, first and second gate structures 160A and 160B including the gate dielectric layers 162, the gate electrode 165, the gate spacer layers 164, and the gate capping layer 166 may be formed.

The gate dielectric layers 162, the gate electrode 165, and the gate spacer layers 164 may be formed to continuously extend in the Y-direction, and may be removed from a portion of regions by an etching process. Accordingly, first and second gate structures 160A and 160B separated from each other in the Y-direction may be formed. In example embodiments, during the removing process, only the gate electrode 165 may be removed or only the gate dielectric layers 162 and the gate electrode 165 may be removed from the region.

A first interlayer insulating layer 192 may be further formed on the first and second gate structures 160A and 160B. The first interlayer insulating layer 192 may fill a region between the first gate structure 160A and the second gate structure 160B.

Figure 18:
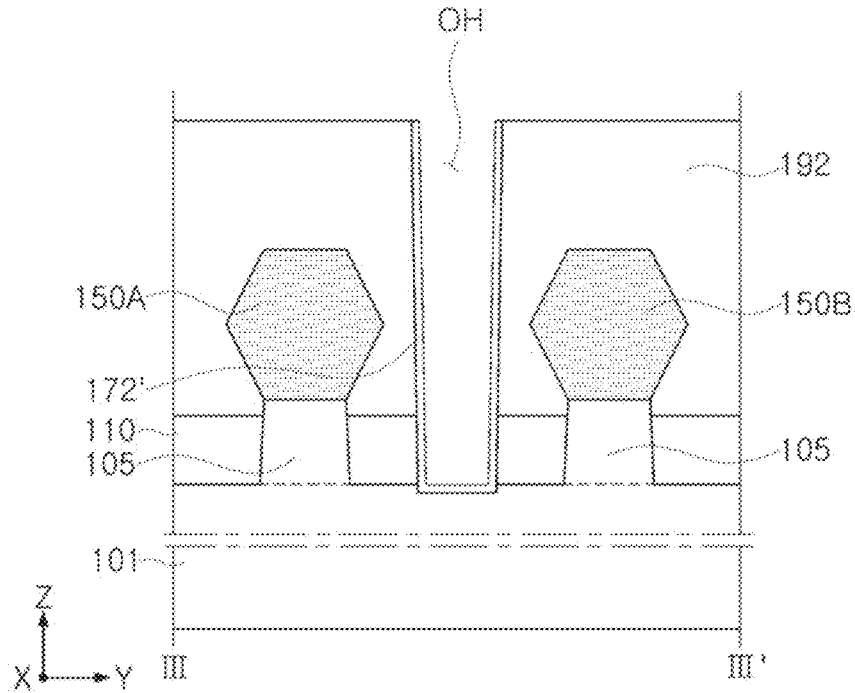

Referring to FIG. 18, an opening OH may be formed and a preliminary vertical insulating layer 172' may be formed.

First, an opening OH may be formed by etching the first interlayer insulating layer 192 and the device isolation layer 110 through an etching process. During the etching process, a portion of the substrate 101 may be removed, but an example embodiment thereof is not limited thereto.

Thereafter, a preliminary vertical insulating layer 172' may be formed to conformally cover the side surface of the first interlayer insulating layer 192, the side surface of the device isolation layer 110, and the upper surface of the substrate 101 in the opening OH.

Figure 19:
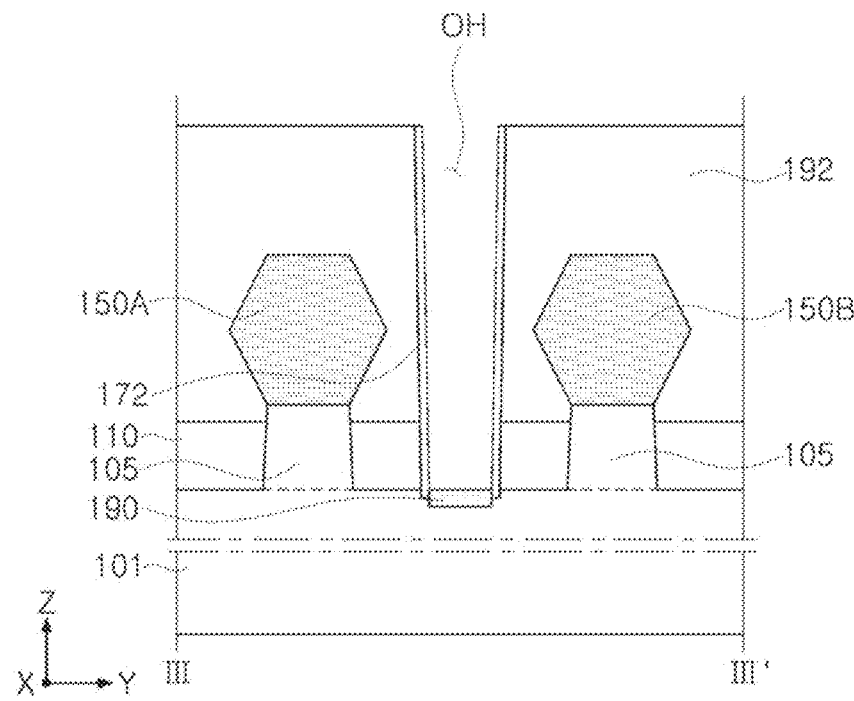

Referring to FIG. 19, a portion of the preliminary vertical insulating layer 172' may be removed, and a metal-semiconductor compound pattern 190 may be formed.

First, the preliminary vertical insulating layer 172' may be removed from the upper surface of the substrate 101. Accordingly, a vertical insulating layer 172 may be formed, and the vertical insulating layer 172 may be present on a side surface of the first interlayer insulating layer 192.

Thereafter, a metal-semiconductor compound pattern 190 may be formed on the bottom surface of the opening OH by performing a process such as a silicide process on the partially exposed substrate 101. Accordingly, the metal-semiconductor compound pattern 190 may penetrate through a portion of the substrate 101. Also, the uppermost portion of the metal-semiconductor compound pattern 190 may be disposed on a level higher than a level of the lowermost portion of the vertical insulating layer 172, but an example embodiment thereof is not limited thereto.

The example embodiment in FIG. 5 may be manufactured by forming the vertical buried structure as in this process without further forming a first interlayer insulating layer 192 between the first gate structure 160A and the second gate structure 160B in the process described above with reference to FIGS. 17A to 17C. However, the method of manufacturing the example embodiments in FIG. 5 is not limited thereto.

Figure 20:
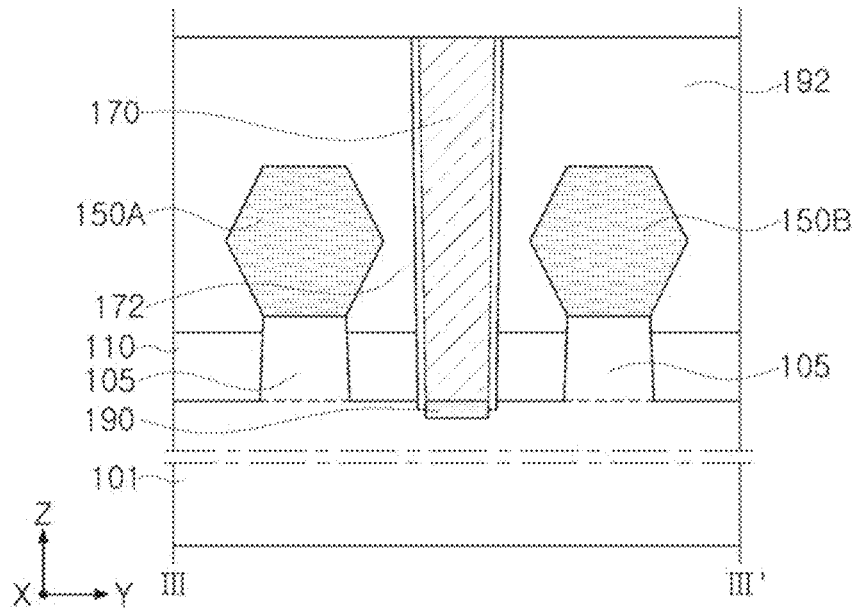

Referring to FIG. 20, a vertical buried structure 170 may be formed in the opening OH.

First, the vertical buried structure 170 in the opening OH may be filled with a conductive material by a bottom-up method. For example, a vertical buried structure 170 may be formed by an atomic layer deposition (ALD) method using, for example, a selectivity between the metal-semiconductor compound pattern 190 and the substrate 101 and the device isolation layer 110 and the first interlayer insulating layer 192. Accordingly, a vertical buried structure 170 may be formed. Accordingly, the vertical buried structure 170 may be formed in a region spaced apart from the first gate structure 160A and the second gate structure 160B in the Y-direction. Also, the vertical buried structure 170 may be formed in a region between the first source/drain region 150A and the second source/drain region 150B adjacent to each other in the Y-direction.

Figure 21:
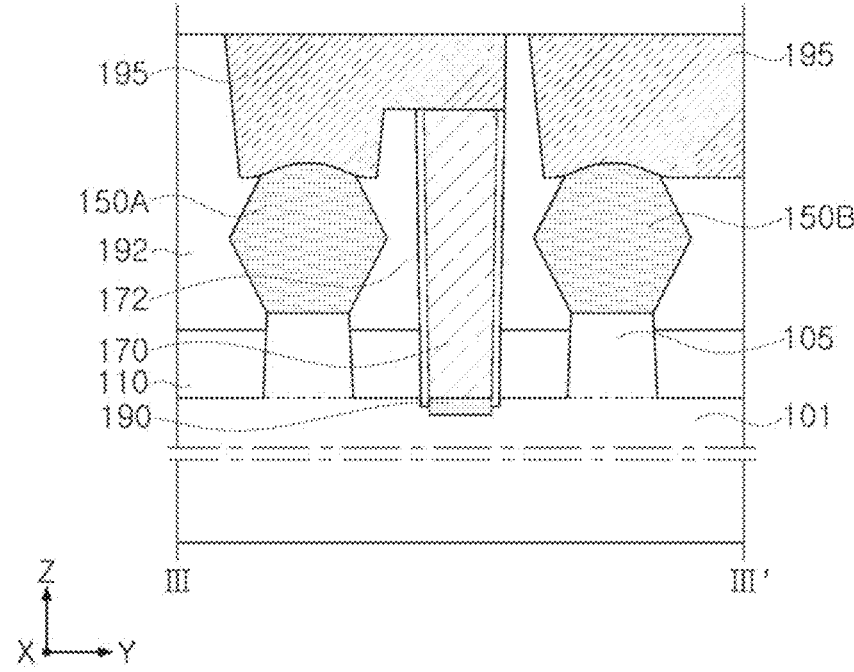

Referring to FIG. 21, contact plugs 195 may be formed.

First, contact holes for forming the contact plugs 195 may be formed. The contact holes may be formed to expose upper surfaces of the first and second source/drain regions 150A and 150B. The contact holes may be formed by selectively removing regions of the first interlayer insulating layer 192 from regions in which the contact plugs 195 are disposed. However, when the first interlayer insulating layer 192 is removed, a portion of the vertical insulating layer 172 and a portion of the vertical buried structure 170 may also be removed.

Thereafter, the contact holes may be filled. When filling the contact holes, the upper surface of the vertical buried structure 170 disposed between contact holes adjacent to each other in the Y-direction and the upper surface of the vertical insulating layer 172 may be covered. If desired, the contact plugs 195 may be formed by performing a planarization process.

Figure 22:
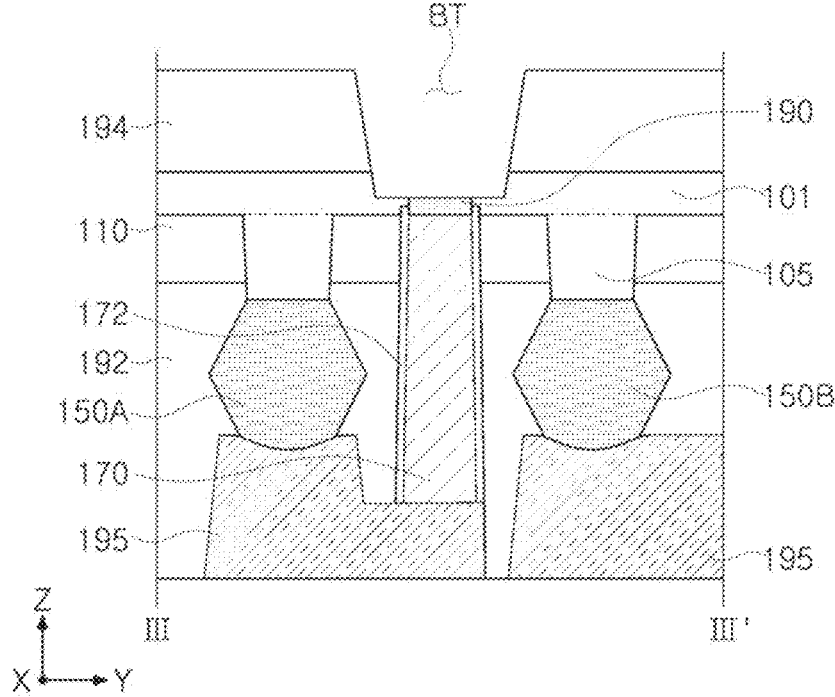

Referring to FIG. 22, the entire structure formed with reference to FIGS. 13A to 21 may be attached to a carrier substrate, and the substrate 101 may be partially removed, a second interlayer insulating layer 194 may be formed, and a trench BT may be formed.

The carrier substrate may be attached to the first interlayer insulating layer 192 to perform a process on the lower surface of the substrate 101 in FIG. 17. In FIG. 22, for ease of description, the entire structure may be rotated or reversed in the form of a mirror image of the structure illustrated in FIG. 21.

The substrate 101 may be removed from the upper surface of the substrate 101 to a predetermined thickness. The substrate 101 may be removed by, for example, a lapping, grinding, or polishing process. The thickness by which the substrate 101 is removed may vary in example embodiments. In example embodiments, the substrate 101 may be completely removed from the device isolation layer 110 (see FIGS. 3A to 3C).

The second interlayer insulating layer 194 may be formed on the thinned substrate 101. In the second interlayer insulating layer 194, a trench BT may be formed in regions in which the horizontal buried structure 180 and the first conductive barrier 182 (see FIGS. 2A to 2C) are disposed. When forming the trench BT, at least a portion of the substrate 101 and the second interlayer insulating layer 194 may be removed. Accordingly, the metal-semiconductor compound pattern 190 may be exposed.

Thereafter, referring to FIGS. 2A to 2C, a horizontal buried structure 180 may be formed by filling a conductive material in the trench BT and the carrier substrate may be removed. Accordingly, the semiconductor device 100 in FIGS. 1 to 2C may be manufactured. The semiconductor device 100 may be packaged in a state in which the horizontal buried structure 180 is disposed thereon, but an example embodiment thereof is not limited thereto.

Figure 23:
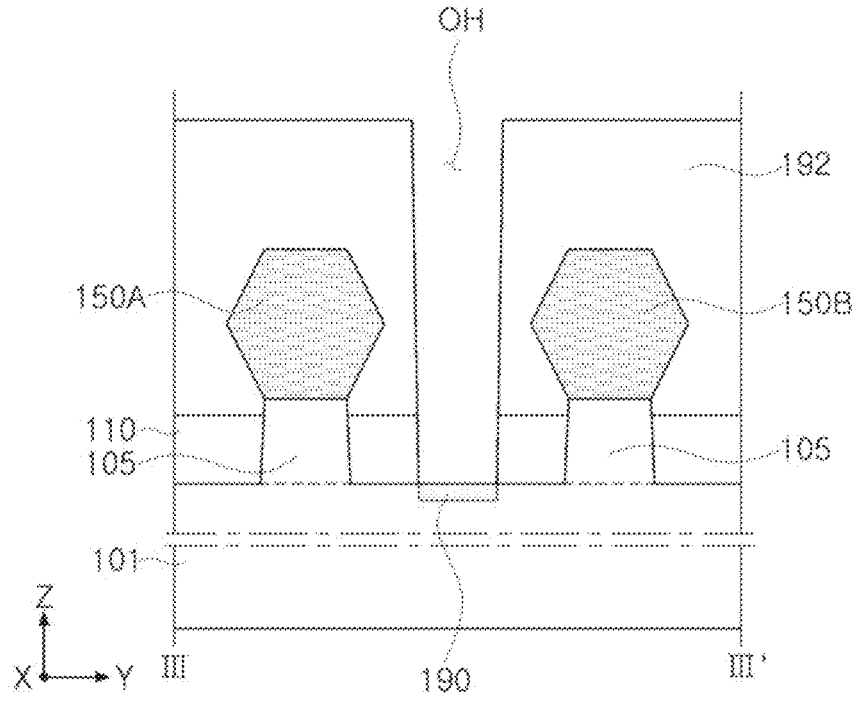
FIGS. 23, 24, and 25 are diagrams illustrating processes of a method of manufacturing a semiconductor device in order according to an example embodiment of the present disclosure.
Figure 24:
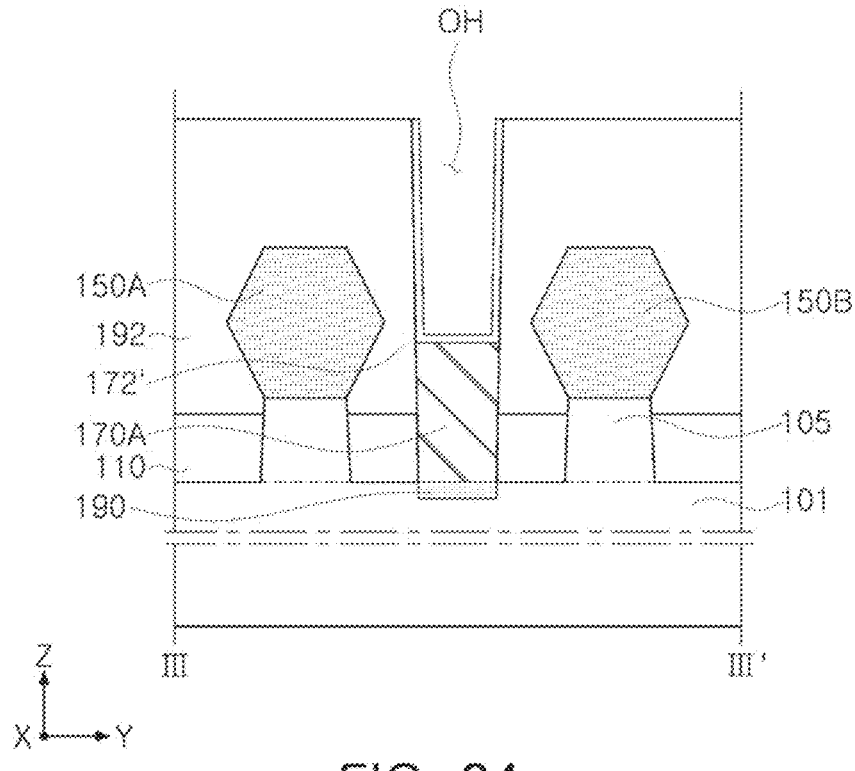
Figure 25:
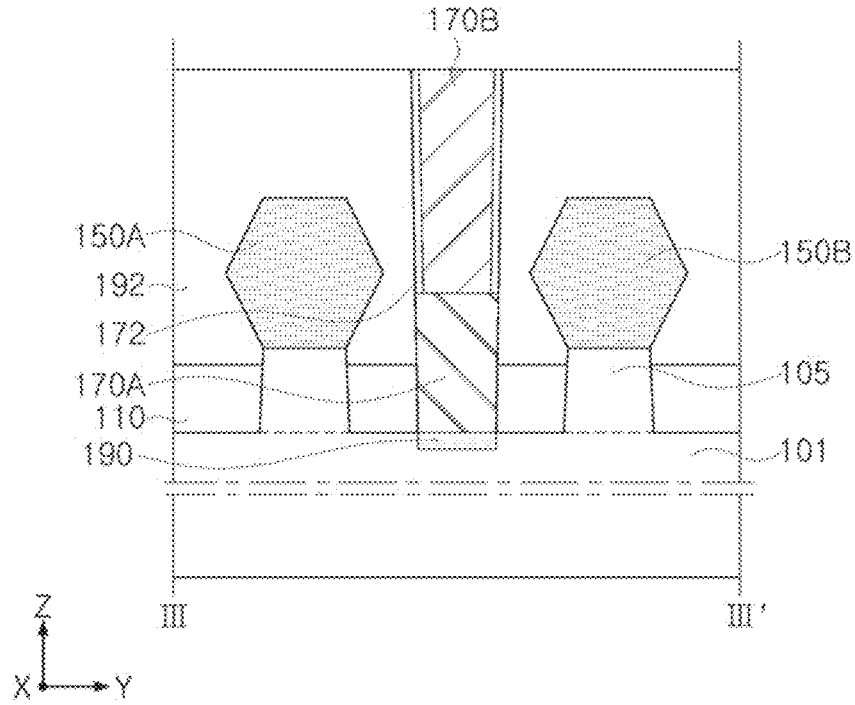

FIGS. 23 to 25 are diagrams illustrating processes of a method of manufacturing a semiconductor device in order according to an example embodiment. For example, FIGS. 23 to 25 are diagrams illustrating an example of a method of manufacturing the semiconductor device 100e in FIG. 7B, and illustrating cross-sections corresponding to FIG. 7B.

First, the same processes as those in FIGS. 13A to 17C described above may be performed.

Thereafter, referring to FIG. 23, an opening OH may be formed and a metal-semiconductor compound pattern 190 may be formed.

First, an opening OH may be formed by etching the first interlayer insulating layer 192 and the device isolation layer 110 through an etching process. During the etching process, a portion of the substrate 101 may be removed, but an example embodiment thereof is not limited thereto.

Thereafter, the metal-semiconductor compound pattern 190 may be formed on the bottom surface of the opening OH by performing a process such as a silicide process. Accordingly, the metal-semiconductor compound pattern 190 may penetrate through a portion of the substrate 101.

Referring to FIG. 24, the first vertical buried structure 170A may be formed, and a preliminary vertical insulating layer 172' may be formed.

First, the first vertical buried structure 170A in the opening OH may be filled in with a conductive material by a bottom-up method. For example, a first vertical buried structure 170A may be formed by an atomic layer deposition (ALD) method using a selectivity between the metal-semiconductor compound pattern 190 and the substrate 101, and the device isolation layer 110 and the first interlayer insulating layer 192. The upper surface of the first vertical buried structure 170A may be disposed on a level higher than a level of the upper surface of the device isolation layer 110, but an example embodiment thereof is not limited thereto.

Thereafter, a preliminary vertical insulating layer 172' may be formed to conformally cover the side surface of the first interlayer insulating layer 192 and the upper surface of the first vertical buried structure 170A.

Referring to FIG. 25, a portion of the preliminary vertical insulating layer 172' may be removed and a second vertical buried structure 170B may be formed.

First, a preliminary vertical insulating layer 172' may be removed from the upper surface of the first vertical buried structure 170A. Accordingly, a vertical insulating layer 172 may be formed, and the vertical insulating layer 172 may be present on a side surface of the first interlayer insulating layer 192.

Thereafter, the second vertical buried structure 170B may be formed to fill the opening OH. Accordingly, the vertical buried structures 170A and 170B may be formed in regions spaced apart from the first gate structure 160A and the second gate structure 160B in the Y-direction. Also, the vertical buried structures 170A and 170B may be formed in a region between the first source/drain region 150A and the second source/drain region 150B adjacent to each other in the Y-direction.

The example embodiment in FIG. 10 may be manufactured by forming the vertical buried structures 170A and 170B as in this process without further forming the first interlayer insulating layer 192 between the first gate structure 160A and the second gate structure 160B in the process described above with reference to FIGS. 17A to 17C. However, the method of manufacturing the example embodiment in FIG. 10 is not limited thereto.

Thereafter, the same process as in FIGS. 21 and 22 described above may be performed, and the process of forming the first conductive barrier 182 and the horizontal buried structure 180 may be performed, thereby manufacturing the semiconductor device 100e in FIG. 7B.

FIGS. 26A to 26E are diagrams illustrating processes of a method of manufacturing a semiconductor device in order according to an example embodiment. For example, FIGS. 26A to 26E are diagrams illustrating an example of a method of manufacturing the semiconductor device in FIG. 12B, and illustrating cross-sections corresponding to FIG. 12B.

First, the same process as those in FIGS. 13A to 17C described above may be performed.

Figure 26A:
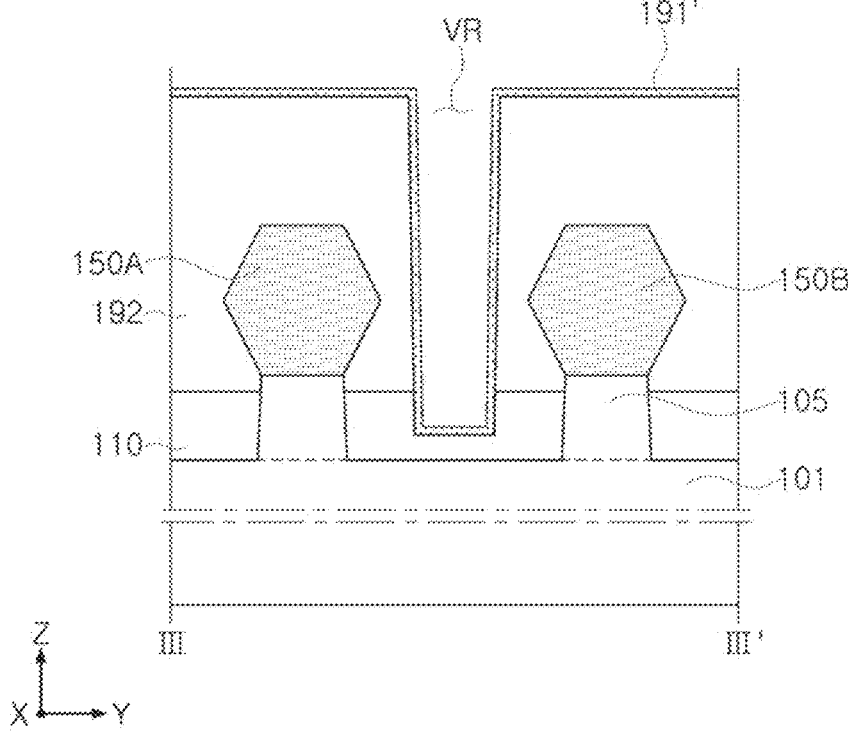
FIGS. 26A, 26B, 26C, 26D, and 26E are diagrams illustrating processes of a method of manufacturing a semiconductor device in order according to an example embodiment of the present disclosure.

Thereafter, referring to FIG. 26A, a portion of the processes described above with reference to FIG. 17A may be performed in the same manner, and a preliminary second conductive barrier 191' may be formed.

A vertical opening VR penetrating through the first interlayer insulating layer 192 and extending into the device isolation layer 110 may be formed, and a preliminary second conductive barrier 191' may be formed in the vertical opening VR. However, an example embodiment thereof is not limited thereto, and the vertical opening VR may penetrate through at least a portion of the substrate 101. The preliminary second conductive barrier 191' may be formed to conformally cover the bottom surface and internal surfaces of the vertical opening VR and the first interlayer insulating layer 192. The preliminary second conductive barrier 191' may include, for example, a metal nitride such as titanium nitride (TiN), tantalum nitride (TaN), molybdenum nitride (MoN), or tungsten nitride (WN), but an example embodiment thereof is not limited thereto.

Figure 26B:
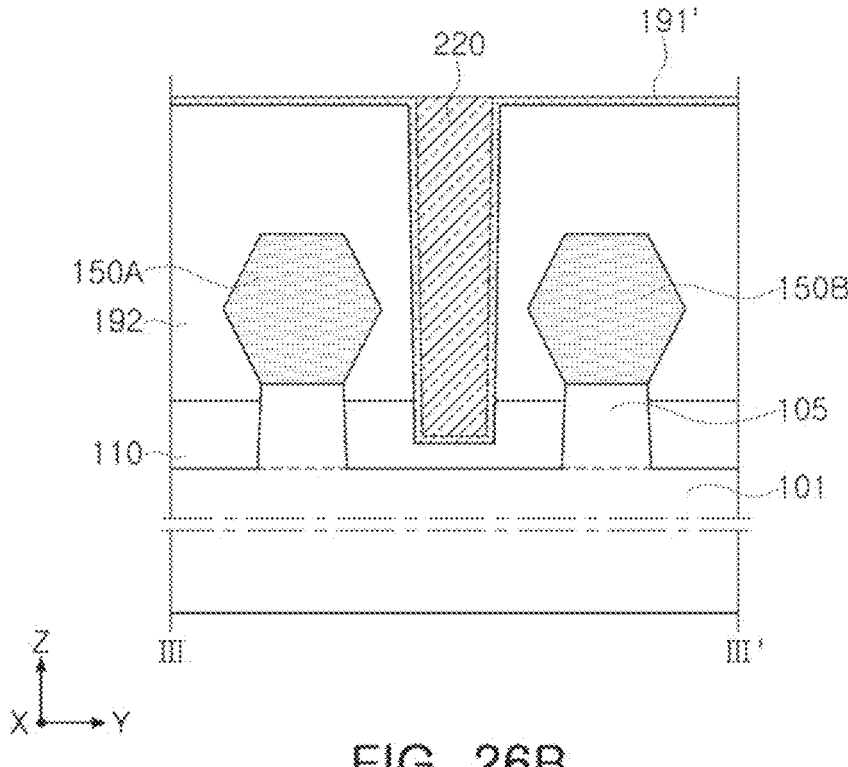

Referring to FIG. 26B, the preliminary second conductive barrier 191' may be formed, and a vertical sacrificial layer 220 may be formed to fill the remaining vertical opening VR region.

The vertical sacrificial layer 220 may be formed in a region corresponding to the vertical buried structures 170A and 170B (see FIG. 12B). The preliminary second conductive barrier 191' may be formed, and the vertical sacrificial layer 220 may be formed to fill the remaining vertical opening VR region. The vertical sacrificial layer 220 may be, for example, a carbon-based material, but an example embodiment thereof is not limited thereto. For example, the vertical sacrificial layer 220 may be a spin-on hardmask (SOH).

Figure 26C:
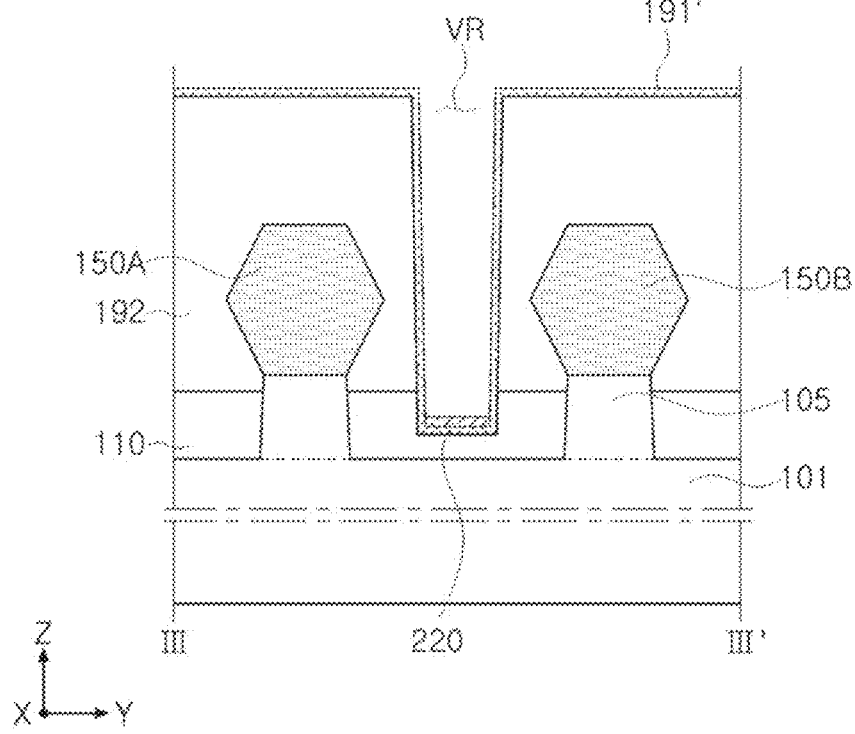

Referring to FIG. 26C, a portion of the vertical sacrificial layer 220 may be removed.

A portion of the vertical sacrificial layer 220 may be selectively removed with respect to the preliminary second conductive barrier 191' and the first interlayer insulating layer 192. Accordingly, a vertical opening VR may be formed. To form the second conductive barrier 191, only a portion of the vertical sacrificial layer 220 may be removed.

Figure 26D:
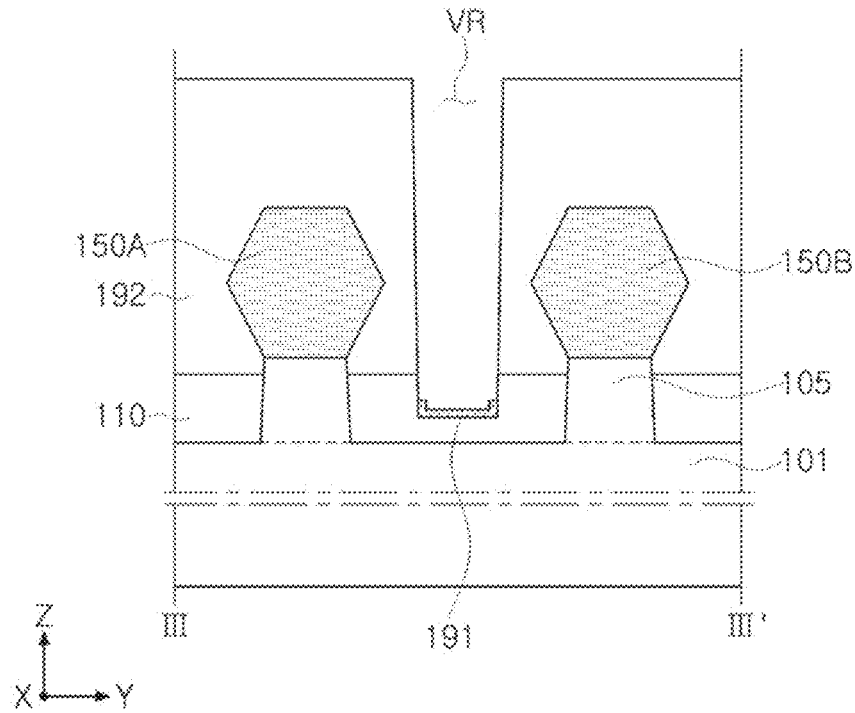

Referring to FIG. 26D, the preliminary second conductive barrier 191' may be partially removed, and the remaining vertical sacrificial layer 220 may be removed, thereby forming the second conductive barrier 191.

The exposed preliminary second conductive barrier 191' may be selectively removed with respect to the vertical sacrificial layer 220 by a wet etching process, and the vertical sacrificial layer 220 may be selectively removed with respect to the preliminary second conductive barrier 191'. Accordingly, the second conductive barrier 191 may be formed.

Thereafter, the same processes as those in FIGS. 23 to 25 and FIG. 21 described above may be performed.

Figure 26E:
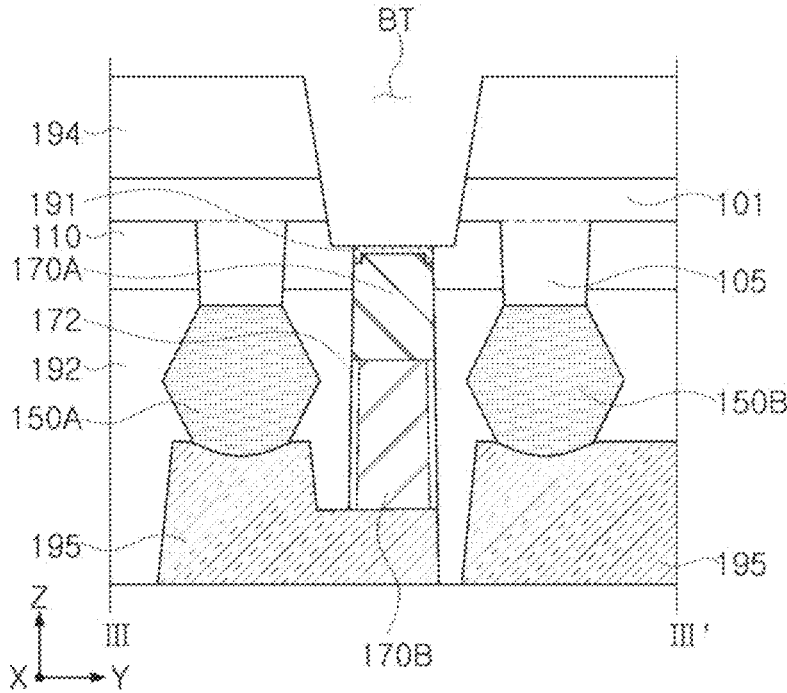

Referring to FIG. 26E, a trench BT may be formed by performing a process substantially the same as the process in FIG. 22. The trench BT may be formed to expose a portion of the device isolation layer 110 or the second conductive barrier 191 present in the substrate 101.

Thereafter, by performing the process of forming the first conductive barrier 182 and the horizontal buried structure 180 described above, the semiconductor device 100j as illustrated in FIG. 12B may be manufactured.

FIGS. 27A to 27F are diagrams illustrating processes of a method of manufacturing a semiconductor device in order according to an example embodiment. For example, FIGS. 27A to 27F are diagrams illustrating an example of a method of manufacturing the semiconductor device 100k in FIG. 12D, and illustrating cross-sections corresponding to FIG. 12D.

Figure 27A:
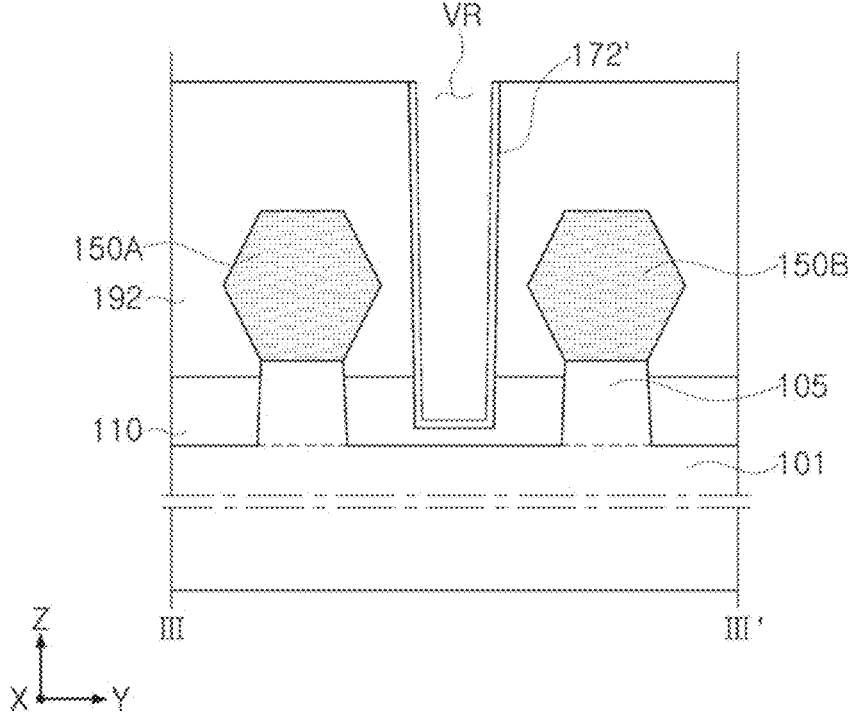
FIGS. 27A, 27B, 27C, 27D, 27E, and 27F are diagrams illustrating processes of a method of manufacturing a semiconductor device in order according to an example embodiment of the present disclosure.

Referring to FIG. 27A, a portion of the processes described above with reference to FIG. 17A may be performed in the same manner, and a preliminary vertical insulating layer 172' may be formed. A vertical opening VR penetrating the first interlayer insulating layer 192 and extending into the device isolation layer 110 may be formed, and a preliminary vertical insulating layer 172' may be formed in the vertical opening VR to conformally cover along the side surface of the first interlayer insulating layer 192 and the exposed surface of the device isolation layer 110.

Figure 27B:
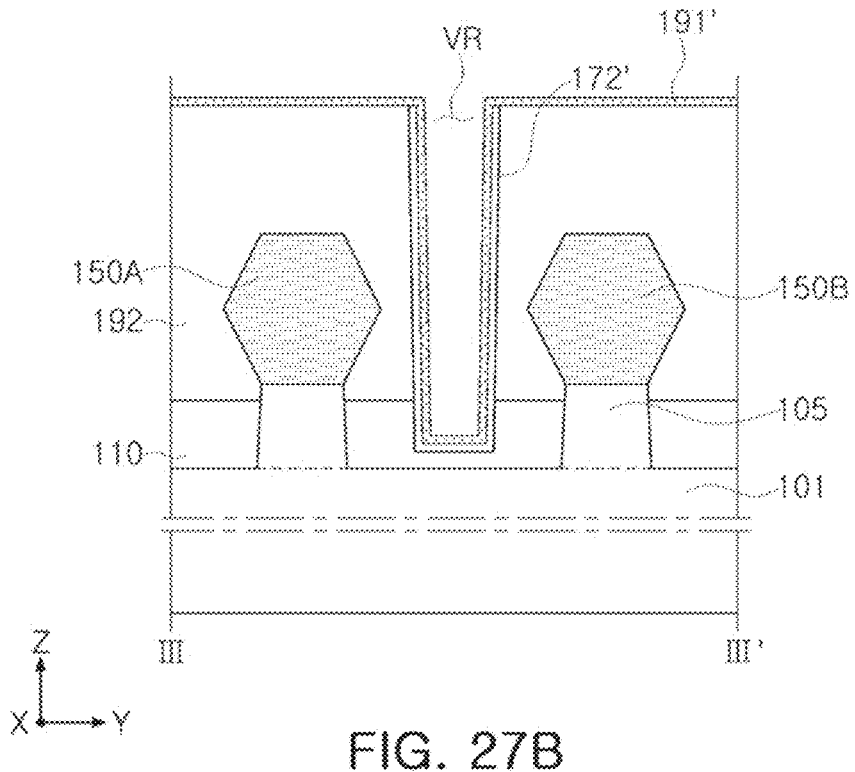

Referring to FIG. 27B, a preliminary second conductive barrier 191' may be formed on the preliminary vertical insulating layer 172'. A preliminary second conductive barrier 191' may be formed to conformally cover along the side surface and the upper surfaces of the preliminary vertical insulating layer 172'.

Figure 27C:
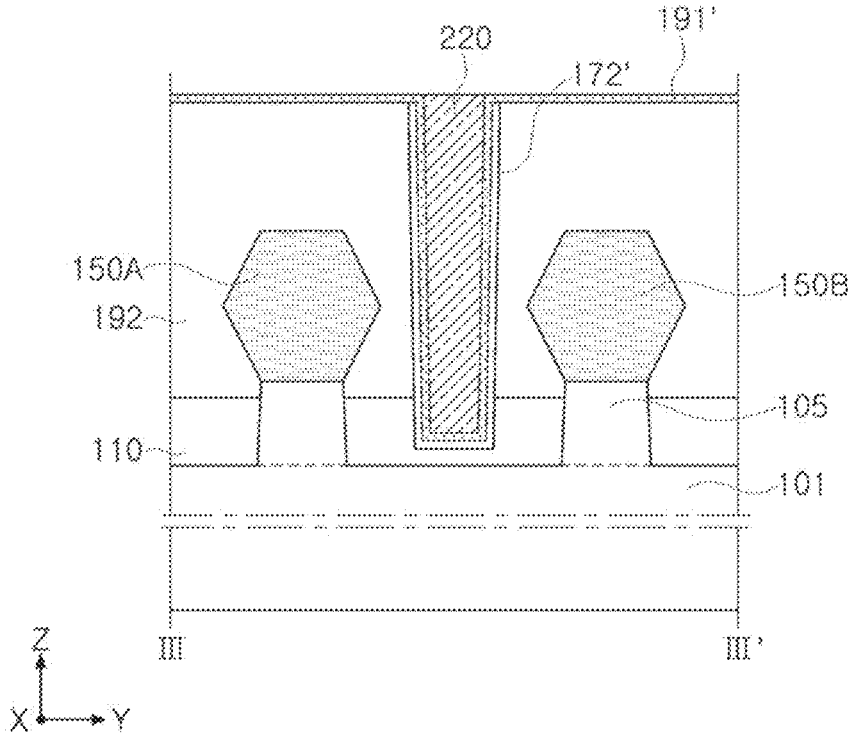

Referring to FIG. 27C, the preliminary second conductive barrier 191' may be formed, and a vertical sacrificial layer 220 may be formed to fill the remaining vertical opening VR region. The vertical sacrificial layer 220 may be formed in a region corresponding to the vertical buried structure 170 (see FIG. 12D).

Figure 27D:
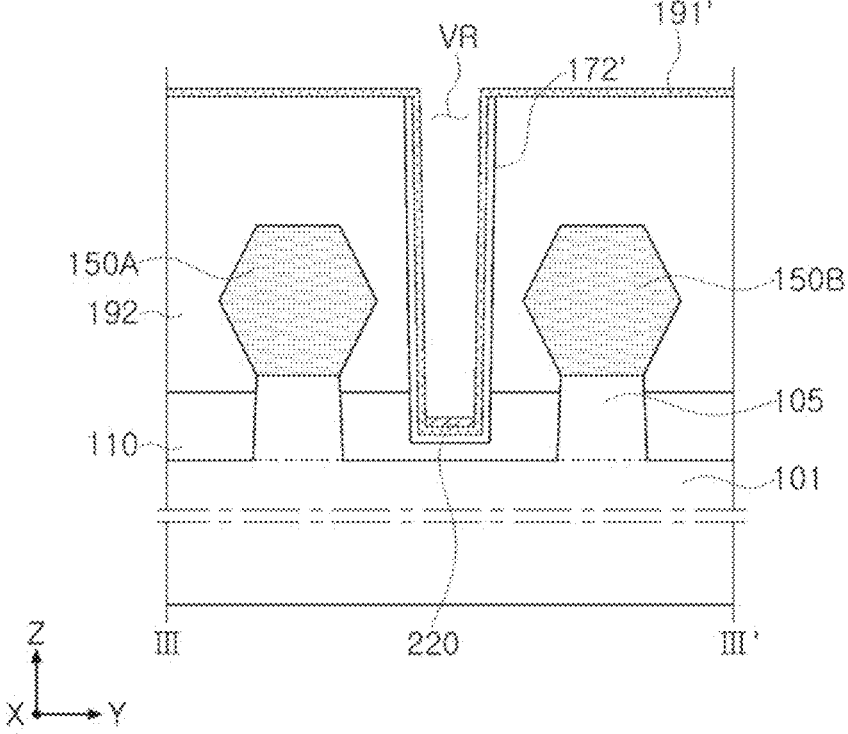

Referring to FIG. 27D, a portion of the vertical sacrificial layer 220 may be removed. Substantially the same process as the process in FIG. 26C may be performed.

Figure 27E:
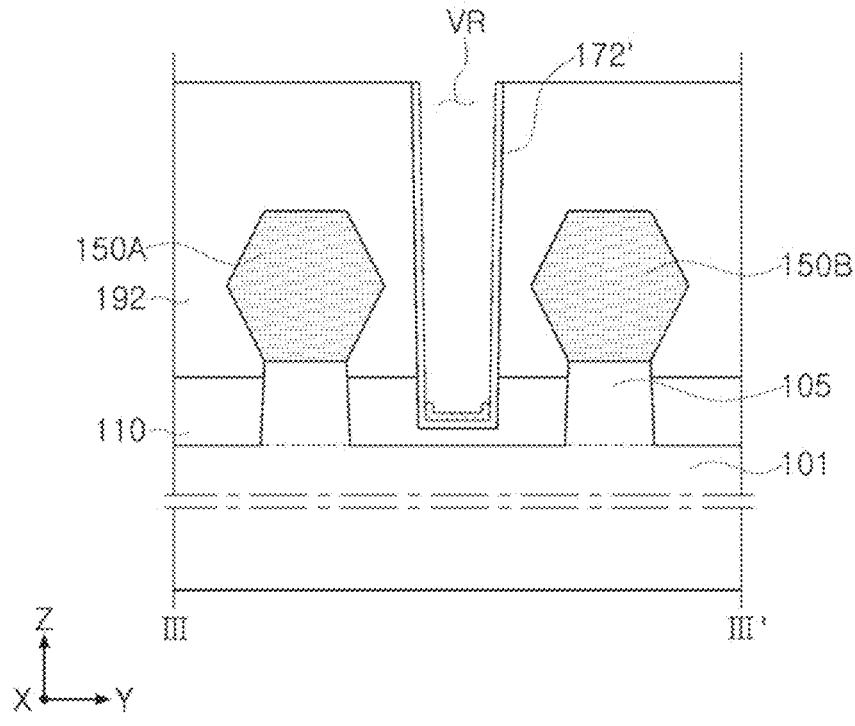

Referring to FIG. 27E, the second conductive barrier 191 may be formed by partially removing the preliminary second conductive barrier 191' and removing the remaining vertical sacrificial layer 220.

The exposed preliminary second conductive barrier 191' may be selectively removed with respect to the vertical sacrificial layer 220 by a wet etching process, and the vertical sacrificial layer 220 may be selectively removed with respect to the preliminary second conductive barrier 191'. Accordingly, the second conductive barrier 191 may be formed.

Figure 27F:
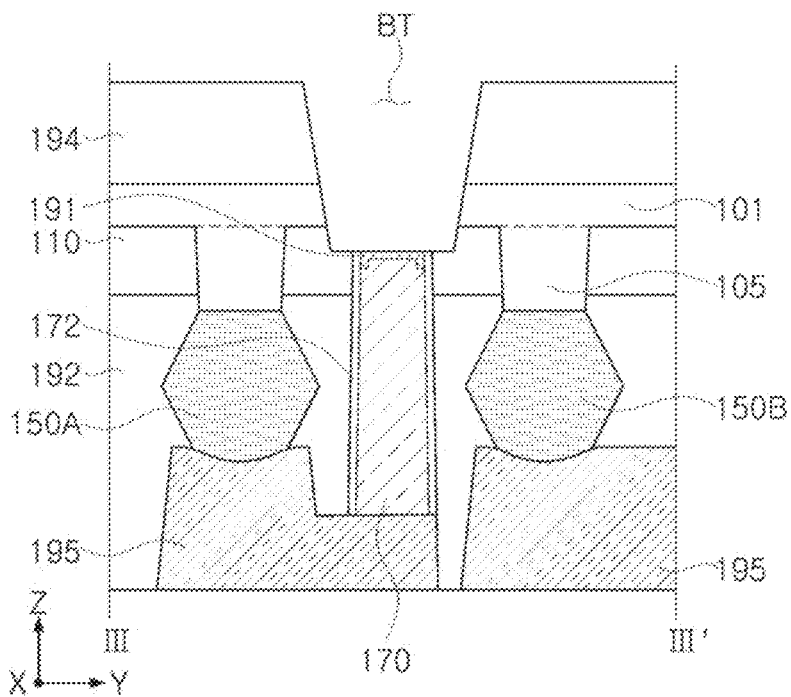

Referring to FIG. 27F, a trench BT may be formed by performing a process substantially the same as the process in FIG. 26E. When forming the trench BT, by removing a portion of the preliminary vertical insulating layer 172', a portion of the device isolation layer 110 or the second conductive barrier 191 present in the substrate 101 may be exposed.

Thereafter, by performing the process of forming the first conductive barrier 182 and the horizontal buried structure 180 described above, the semiconductor device 100k as illustrated in FIG. 12D may be manufactured.

According to the aforementioned example embodiments, by including a vertical insulating layer covering at least a portion of the side surfaces of vertical buried structures, a semiconductor device having improved integration density and electrical properties may be provided.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:

a substrate including active regions extending in a first direction;

a device isolation layer surrounding the active regions on the substrate;

gate structures intersecting the active regions and extending on the substrate in a second direction;

source/drain regions on the active regions at sides of the gate structures;

contact plugs on the source/drain regions and connected to the source/drain regions, respectively;

a vertical buried structure penetrating through at least a portion of the device isolation layer, spaced apart from the gate structures in the second direction, and in contact with at least one of the contact plugs;

a vertical insulating layer covering at least a portion of side surfaces of the vertical buried structure;

a horizontal buried structure below the vertical buried structure;

a first conductive barrier covering at least a portion of an upper surface and side surfaces of the horizontal buried structure; and a metal-semiconductor compound pattern between the vertical buried structure and the first conductive barrier, wherein the vertical buried structure is between source/drain regions adjacent to each other in the second direction among the source/drain regions at the sides of the gate structures.

2. The semiconductor device of claim 1, wherein an upper surface of the vertical buried structure is on a level higher than a level of an upper surface of each of the source/drain regions.

3. The semiconductor device of claim 1, wherein a lower surface of the vertical buried structure is on a level lower than a level of a lower surface of each of the source/drain regions.

4. The semiconductor device of claim 1, further comprising:

a plurality of channel layers spaced apart from each other in a third direction perpendicular to an upper surface of the substrate and surrounded by the gate structures on each of the active regions, wherein an upper surface of the vertical buried structure is in contact with a lower surface of the contact plugs.

5. The semiconductor device of claim 1, wherein, in the vertical buried structure, both side surfaces in the second direction include regions having different slopes.

6. The semiconductor device of claim 1, wherein the metal-semiconductor compound pattern is spaced apart from the substrate by the vertical insulating layer.

7. The semiconductor device of claim 1, further comprising:

a first interlayer insulating layer covering at least a portion of the source/drain regions, the gate structures, and the device isolation layer.

8. The semiconductor device of claim 1, wherein the vertical insulating layer is in contact with the first conductive barrier.

9. The semiconductor device of claim 1, wherein the metal-semiconductor compound pattern is in contact with the vertical buried structure, the vertical insulating layer, and the first conductive barrier.

10. The semiconductor device of claim 1, wherein the metal-semiconductor compound pattern penetrates at least a portion of the substrate.

11. The semiconductor device of claim 1, wherein the vertical insulating layer covers at least a portion of a side surface of the metal-semiconductor compound pattern.

12. The semiconductor device of claim 1, further comprising:

a second interlayer insulating layer covering at least a portion of the horizontal buried structure and the metal-semiconductor compound pattern.

13. The semiconductor device of claim 12, wherein an uppermost portion of the second interlayer insulating layer is on a level higher than a level of a lowermost portion of the device isolation layer.

14. A semiconductor device, comprising:

a substrate including active regions extending in a first direction;

a device isolation layer surrounding the active regions on the substrate;

gate structures intersecting the active regions and extending on the substrate in a second direction;

source/drain regions on the active regions at sides of the gate structures;

contact plugs on the source/drain regions and connected to the source/drain regions, respectively;

vertical buried structures including a first vertical buried structure penetrating through at least a portion of the device isolation layer, and a second vertical buried structure spaced apart from the gate structures in the second direction and in contact with at least one of the contact plugs;

a vertical insulating layer covering at least a portion of side surfaces of the vertical buried structures;

a horizontal buried structure on a lower surface of the first vertical buried structure; and a first conductive barrier covering at least a portion of an upper surface and side surfaces of the horizontal buried structure, wherein the vertical buried structures are between source/drain regions adjacent to each other in the second direction among the source/drain regions at the sides of the gate structures.

15. The semiconductor device of claim 14, wherein the first vertical buried structure and the second vertical buried structure include substantially the same material.

16. The semiconductor device of claim 14, further comprising:

a metal-semiconductor compound pattern between the first vertical buried structure and the first conductive barrier.

17. The semiconductor device of claim 14, further comprising:

a second conductive barrier between the first vertical buried structure and the first conductive barrier.

18. The semiconductor device of claim 17, wherein a lowermost portion of the first vertical buried structure is disposed in the device isolation layer, and wherein the second conductive barrier is in contact with the first vertical buried structure and the first conductive barrier.

19. The semiconductor device of claim 17, wherein the second conductive barrier includes at least one of Ti, TiN, Mo, MoN, Ta, and TaN.

20. A semiconductor device, comprising:

a substrate including active regions extending in a first direction;

a device isolation layer surrounding the active regions on the substrate;

gate structures intersecting the active regions and extending on the substrate in a second direction;

source/drain regions on the active regions at sides of the gate structures;

contact plugs on the source/drain regions and connected to the source/drain regions, respectively;

vertical buried structures including a first vertical buried structure penetrating through at least a portion of the device isolation layer and a second vertical buried structure on the first vertical buried structure and in contact with at least one of the contact plugs;

a vertical insulating layer covering at least a portion of side surfaces of the vertical buried structures;

a horizontal buried structure below the first vertical buried structure; and a metal-semiconductor compound pattern on the first vertical buried structure and the horizontal buried structure, wherein an upper surface of the second vertical buried structure is on a level higher than a level of an upper surface of each of the source/drain regions, and wherein a lowermost portion of the vertical insulating layer is on a level lower than a level on which a maximum width of each of the source/drain regions in the second direction is disposed.

* * * * *